US010249623B2

(12) United States Patent
Tanaka

(10) Patent No.: US 10,249,623 B2
(45) Date of Patent: Apr. 2, 2019

(54) SEMICONDUCTOR INTEGRATED CIRCUIT

(71) Applicant: FUJI ELECTRIC CO., LTD., Kawasaki-shi, Kanagawa (JP)

(72) Inventor: Takahide Tanaka, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/886,447

(22) Filed: Feb. 1, 2018

(65) Prior Publication Data

US 2018/0269208 A1     Sep. 20, 2018

(30) Foreign Application Priority Data

Mar. 17, 2017   (JP) .................................. 2017-053178

(51) Int. Cl.
| H01L 27/092 | (2006.01) |
| H01L 27/06 | (2006.01) |
| H01L 29/866 | (2006.01) |
| H01L 29/417 | (2006.01) |

(52) U.S. Cl.
CPC ...... H01L 27/0922 (2013.01); H01L 27/0623 (2013.01); H01L 27/0928 (2013.01); H01L 29/41766 (2013.01); H01L 29/866 (2013.01)

(58) Field of Classification Search
CPC ............. H01L 27/0922; H01L 27/0623; H01L 27/0928; H01L 29/866; H01L 29/41766
See application file for complete search history.

(56) References Cited

U.S. PATENT DOCUMENTS

| 2015/0023082 A1 | 1/2015 | Yamaji et al. |
| 2015/0236013 A1 | 8/2015 | Yamaji |
| 2018/0269208 A1* | 9/2018 | Tanaka ................ H01L 27/0922 |

FOREIGN PATENT DOCUMENTS

| JP | 2015-173255 A | 10/2015 |
| JP | 5825443 B2 | 12/2015 |

* cited by examiner

*Primary Examiner* — Mark Prenty
(74) *Attorney, Agent, or Firm* — Rabin & Berdo, P.C.

(57) ABSTRACT

A semiconductor integrated circuit includes semiconductor substrate having a plurality of first potential side areas, including a first two adjacent first potential side areas, each first potential side area having a high potential side circuit, a first semiconductor region of a first conductivity type selectively provided in a surface layer on a front surface of a semiconductor substrate, a second semiconductor region of a second conductivity type selectively provided in the first semiconductor region, penetrating the first semiconductor region in a depth direction, a third semiconductor region of the first conductivity type selectively provided in the first semiconductor region so as to be separated from the second semiconductor region. Each of the first two adjacent first potential side areas includes a first side area facing the other, each first side area includes the third semiconductor region, and is free of the second semiconductor region.

7 Claims, 26 Drawing Sheets

FIG.20A1
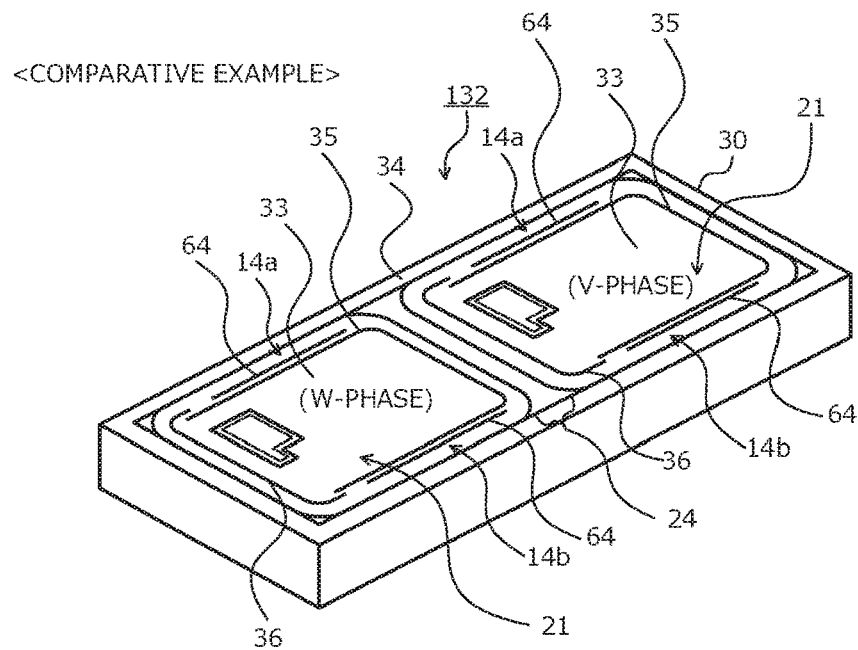
FIG.20A2
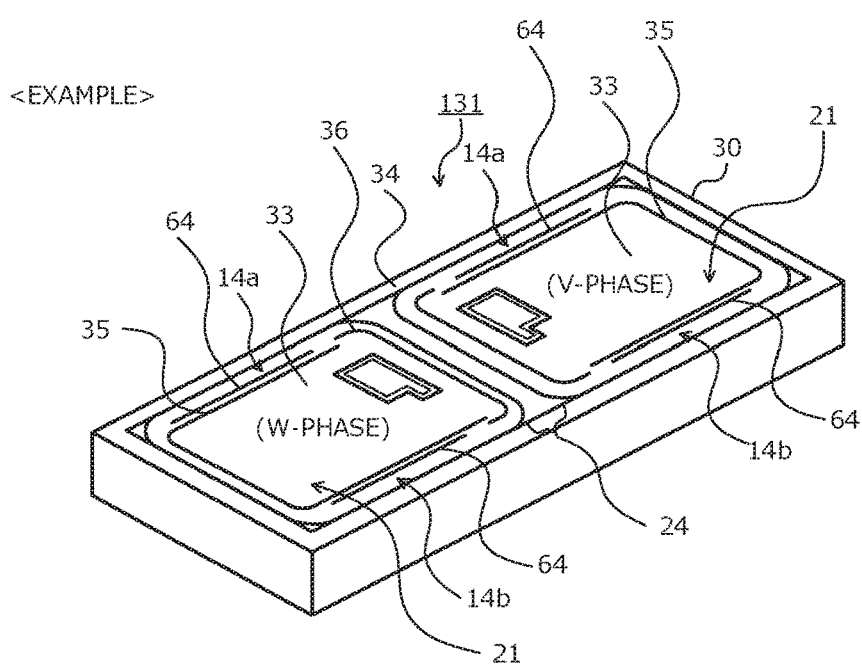

FIG.20B1
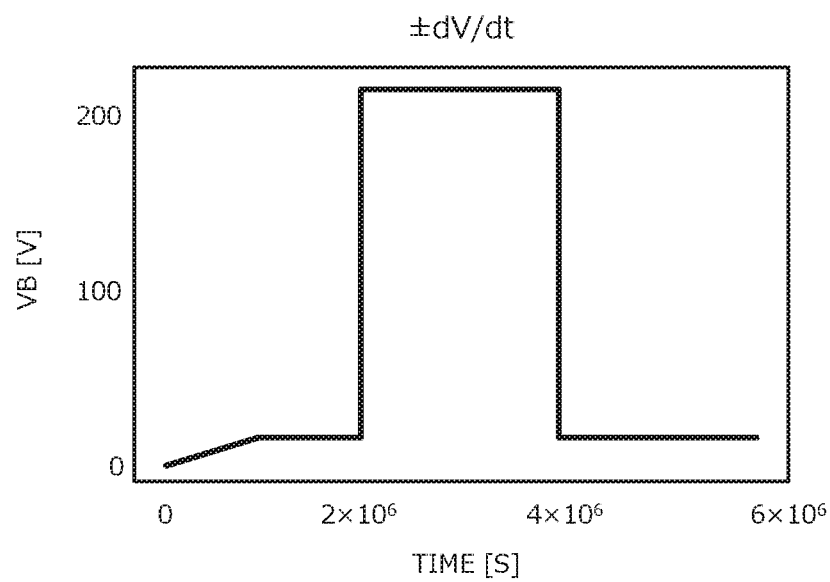
FIG.20B2
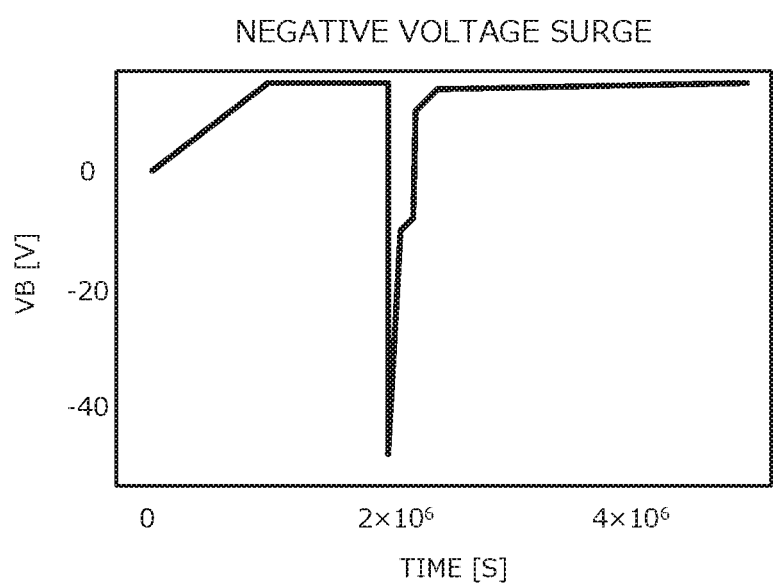

FIG.20C1
<COMPARATIVE EXAMPLE>
| ±dV/dt | |
|---|---|
| MAXIMAL CURRENT (GND) | -1.08×10⁻¹ |
| MAXIMAL CURRENT (OTHER PHASE Dr) | -9.55×10⁻⁴ |
| RATIO OF CURRENT INJECTED | 0.8842% |
44% REDUCTION
<EXAMPLE>
| ±dV/dt | |
|---|---|
| MAXIMAL CURRENT (GND) | -1.04×10⁻¹ |
| MAXIMAL CURRENT (OTHER PHASE Dr) | -5.19×10⁻⁴ |
| RATIO OF CURRENT INJECTED | 0.4990% |

FIG. 20C2

<COMPARATIVE EXAMPLE>

| NEGATIVE VOLTAGE SURGE | |
|---|---|
| MAXIMAL CURRENT (GND) | $4.25 \times 10^{1}$ |
| MAXIMAL CURRENT (OTHER PHASE Dr) | $9.09 \times 10^{-4}$ |
| RATIO OF CURRENT INJECTED | 0.0021% |

99.5% REDUCTION ⇧

<EXAMPLE>

| NEGATIVE VOLTAGE SURGE | |
|---|---|
| MAXIMAL CURRENT (GND) | $4.24 \times 10^{1}$ |
| MAXIMAL CURRENT (OTHER PHASE Dr) | $4.46 \times 10^{-6}$ |
| RATIO OF CURRENT INJECTED | 0.0000% |

SEMICONDUCTOR INTEGRATED CIRCUIT

CROSS REFERENCE TO RELATED APPLICATIONS

This application is based upon and claims the benefit of priority of the prior Japanese Patent Application No. 2017-053178, filed on Mar. 17, 2017, the entire contents of which are incorporated herein by reference.

BACKGROUND OF THE INVENTION

1. Field of the Invention

Embodiments of the present invention relate to a semiconductor integrated circuit.

2. Description of the Related Art

For a high voltage integrated circuit (HVIC), a conventionally known separation method uses a high voltage junction that electrically separates a high potential side (a high side) circuit region and a low potential side (a low side) circuit region provided on a single semiconductor substrate (a semiconductor chip) from each other using a high voltage junction termination region (HVJT) provided between these circuit regions.

The HVIC has a function of converting an input signal using, as a benchmark, the ground potential (the ground) GND that is a reference potential of the low side circuit region, into a signal at a potential higher than the ground potential GND and a function of using, as a benchmark, a reference potential VS of the high side circuit region, and outputting the converted signal to the exterior. Based on these functions, the HVIC may be used for driving a gate of an insulated gate bipolar transistor (IGBT) on the high side (an upper arm) constituting a half-bridge circuit.

Because the HVIC is used to transmit a signal between the high side circuit region and the low side circuit region as described above, these regions are at different potentials and need to be electrically separated from each other. Although some methods have been proposed as the separation methods each of electrically separating the regions at different potentials from each other, the HVIC may be manufactured (fabricated) most inexpensively by a self-isolation method according to which the HVJT is formed using a pn-junction between a p-type diffusion region and an n-type diffusion region. The "diffusion region" refers to a region that is formed by introducing an impurity into a semiconductor substrate using ion implantation or the like.

With the self-isolation method, an n-type diffusion region that is formed in the surface layer of a p-type semiconductor substrate and whose diffusion depth is large is self-isolation from a portion other than the n-type diffusion region, of the p-type semiconductor substrate (hereinafter, referred to as "p-type substrate region") by a pn-junction of the n-type diffusion region and the p-type substrate region. The potential of the p-type substrate region is fixed at the ground potential GND and the potential of the n-type diffusion region is fixed at a highest potential VB of a high side driving circuit. The n-type diffusion region constitutes the high side circuit region and the high side driving circuit is arranged in the n-type diffusion region.

Because the potential of the high side circuit region is usually higher than the ground potential GND, the pn-junction between the n-type diffusion region and the p-type substrate region is reversely biased and no current flows therethrough. When the potential of the high side circuit region becomes lower than the ground potential GND due to a noise or the like (a negative voltage surge occurs), the pn-junction between the n-type diffusion region and the p-type substrate region is biased forward and a large current flows therethrough. When this current flows excessively into the circuit region, a malfunction of the circuit unit arranged in the circuit region may be induced.

The following device has been proposed as the HVIC whose circuit unit is prevented from malfunctioning. A p-type separation region is arranged in a substantially C-shape layout that surrounds the central portion of a high side circuit region along three sides of the high side circuit region having a substantially rectangular planar shape. A contact region to extract (pick up) the highest potential VB of the high side driving circuit (hereinafter, referred to as "VB pick-up region") is arranged along the remaining one side along which the p-type separation region is not arranged, of the high side circuit region (see, for example, Japanese Laid-Open Patent Publication No. 2015-173255 (Paragraphs 0081 and 0082, and FIG. 1)).

In Japanese Laid-Open Patent Publication No. 2015-173255, carriers (electrons/holes) flowing through a parasitic diode formed by the pn-junction between the p-type separation region and the n-type diffusion region (the high side circuit region) mainly flow into the high side circuit region through a vicinity of the VB pick-up region to pick up the highest potential VB of the high side driving circuit. When a negative surge occurs in the high side circuit region (in one phase), the p-type separation region surrounding the periphery of the high side circuit region acts as a potential barrier and an injection of the holes into the high side circuit region is thereby suppressed. Malfunction of the circuit unit in the one phase caused by a noise occurring in the one phase is suppressed.

A structure of the conventional HVIC will be described. FIG. 21 is a plan diagram of a planar layout of the conventional HVIC. FIG. 21 is FIG. 1 of Japanese Laid-Open Patent Publication No. 2015-173255 below. The "planar layout" refers to the planar shapes and the configuration of the components as seen from the front surface side of a semiconductor substrate (the semiconductor chip) 201. The conventional HVIC depicted in FIG. 21 includes n-type diffusion regions (n-type well regions) 202, 203 and 212 that are each selectively provided in the surface layer of the front surface of the p-type semiconductor substrate 201, an n⁻-type diffusion region (an n⁻-type well region) 204, and a p-type diffusion regions 211 and 213.

The n-type diffusion region 203 constitutes the high side circuit region 221. In the n-type diffusion region 203, a diffusion region 231 whose potential is fixed at the reference potential VS of the high side circuit region, a diffusion region 232 whose potential is fixed at the highest potential VB of the high side driving circuit, and electrode pads 233 to 235 are arranged. The high side driving circuit is arranged in each of the diffusion regions 231 and 232. The n-type diffusion region 203 has an n-type contact region 212 (212a) to be a contact part for a pick-up electrode 214 (214a) selectively provided therein. The pick-up electrode 214 (214a) is electrically connected to a VB electrode pad 233.

The n-type diffusion region 203 has a p-type separation region 213 provided therein in a substantially C-shape planar layout that surrounds the periphery of the diffusion regions 212 (212a), 231, and 232, and the electrode pads 233 to 235, and along the three sides of the n-type diffusion region 203 having a substantially rectangular planar shape. Along the remaining one side of the n-type diffusion region 203, the n-type contact regions 212 (212b and 212c) are selectively provided. The n-type contact regions 212 (212b and 212c) are electrically connected to the pick-up electrodes 214 (214b and 214c), respectively.

The p-type separation region 213 penetrates the n-type diffusion region 203 in the depth direction and is in contact with a p-type region (not depicted) on the rear surface side of the substrate, and the potential thereof is fixed at the ground potential GND. A region surrounded by the p-type separation region 213, of the n-type diffusion region 203 is electrically separated from the other regions in accordance with the self-isolation method based on a pn-junction formed between the n-type diffusion region 203 and the p-type separation region 213, except a region 213a in a vicinity of the remaining one side along which the p-type separation region 213 is not arranged, of the n-type diffusion region 203. When a negative voltage surge occurs, the p-type separation region 213 acts as a potential barrier and suppresses injection of holes into the region surrounded by the p-type separation region 213, of the n-type diffusion region 203.

The "p-type region on the rear surface side of the substrate" refers to the portion remaining as a p-type region because these diffusion regions 202 to 204 are not formed in the portion located deeper from the front surface of the substrate than the diffusion regions 202 to 204, of the p-type semiconductor substrate 201. In FIG. 21, the pick-up electrodes 214 (214a to 214c) and a pick-up electrode 216 described later are indicated by black squares (■) interspersed in the n+-type contact regions 212 (212a to 212c) and the p+-type contact region 215 respectively in contact with the pick-up electrodes 214 (214a to 214c) and 216.

The n−-type diffusion region 204, the p-type diffusion region 211, and the n-type diffusion region 202 are arranged in substantially concentric circular planar layouts surrounding the periphery of the n-type diffusion region 203. The n−-type diffusion region 204 is in contact with the n-type diffusion region 203 on its inner circumference side, and the p-type diffusion region 211 is in contact with the n−-type diffusion region 204 on its inner circumference side. The potential of the p-type diffusion region 211 is fixed at the ground potential GND. The n-type diffusion region 202 is in contact with the p-type diffusion region 211 on its inner circumference side.

The p-type diffusion region 211 has the p+-type contact region 215 selectively provided therein in an annular planar layout that surrounds the periphery of the n-type diffusion region 203. The p+-type contact region 215 is electrically connected to the pick-up electrode 216 at the ground potential GND. An HVJT 223 is configured by a parasitic diode that is formed by a pn-junction formed between the n-type contact regions 212 (212a to 212c) and the n−-type diffusion region 204, and the p-type diffusion region 211 and the p+-type contact region 215.

In the HVJT 223, n-channel metal oxide semiconductor field effect transistors (MOSFETs) 241 and 242 that constitute a level shifting circuit for setting and resetting of the high side driving circuit are arranged. The n-type diffusion region 202 constitutes a low side circuit region 222. In the n-type diffusion region 202, a low side driving circuit is arranged.

An HVIC that includes (three) gate driving circuits for three phases on a single chip and individually drives IGBTs in upper arms in the phases by the gate driving circuits (hereinafter, referred to as "three-phase one-chip HVIC") has been proposed as another example of the HVIC. When the three-phase one-chip HVIC is fabricated in accordance with the self-isolation method, three n-type diffusion regions (the high side circuit regions) electrically separated from each other using the self-isolation method are arranged on a single semiconductor substrate and the three n-type diffusion regions each have a high side driving circuit of one of the phases arranged therein.

In the three-phase one-chip HVIC, when the pn-junction between the p-type substrate region and the n-type diffusion region in another phase is biased forward by a noise or the like and a large current flows therethrough, a portion of the current flows into the n-type diffusion region in the one phase through the p-type substrate region and a malfunction of a circuit unit arranged in the n-type diffusion region in the one phase may be induced. In the three-phase one-chip HVIC, the circuit unit may malfunction in the n-type diffusion region in the one phase caused by a noise generated in the n-type diffusion region in another phase (hereinafter, referred to as "interphase noise").

A device having a level shifting element arranged in a portion not facing any other n-type diffusion region, inside plural n-type diffusion regions (a high side circuit region) has been proposed as a conventional three-phase one-chip HVIC (see, for example, Japanese Patent No. 5825443 below (Paragraphs 0038 and 0054, and FIG. 1)). In Japanese Patent No. 5825443, malfunction caused by an interphase noise is suppressed by setting the distance from one side facing the n-type diffusion region in another phase, of the n-type diffusion region in the one phase to a level shifting element arranged in the n-type diffusion region in the one phase to be 150 μm or longer.

The structure of the three-phase one-chip HVIC will be described. FIGS. 22A and 22B are plan diagrams of a planar layout of another example of a conventional HVIC. FIG. 22B depicts the vicinity of an n+-type drain region 255 of an n-channel MOSFET 241 of a U-phase of FIG. 22A. FIGS. 22A and 22B are FIG. 1 of Japanese Patent No. 5825443. The conventional HVIC depicted in FIGS. 22A and 22B differs from the conventional HVIC depicted in FIG. 21 in that the three n-type diffusion regions 203 (the high side circuit regions 221) are arranged being separated from each other to form the three-phase one-chip HVIC.

In each of the three n-type diffusion regions 203, a high side driving circuit (not depicted) and the level shifting circuit that includes as one combination the n-channel MOSFETs 241 and 242, are arranged. The high side driving circuit of each of the n-type diffusion regions 203 drives the gate of the IGBT in each of the upper arms of the half-bridge circuits in the three phases (the U-phase, a V-phase, and a W-phase). The three n-type diffusion regions 203 are arranged in parallel to each other in the surface layer of the front surface of the p-type semiconductor substrate 201.

The n-type diffusion regions 203 each have a substantially rectangular planar shape. In each of the n-type diffusion regions 203, the n-channel MOSFETs 241 and 242 are arranged respectively along one pair of opposing sides 203a and 203b each not facing any other n-type diffusion region 203. The n-channel MOSFETs 241 and 242 are each a level shifting element arranged employing a self-shielding method in each of the n-type diffusion regions 203. The "self-shielding method" refers to a technique of arranging the level shifting element in the n−-type diffusion region 204 that is a voltage withstanding region.

The n-channel MOSFETs 241 and 242 cause a malfunction when a large current is injected thereto from the n-type diffusion region 203 adjacent to the n-type diffusion region 203 in which the n-channel MOSFETs 241 and 242 are arranged. In the n-type diffusion region 203 in which the n-channel MOSFETs 241 and 242 are arranged, the distances L1 and L2 respectively from the n-channel MOSFETs 241 and 242 to one side 203c that faces the adjacent n-type diffusion region 203 are, therefore, each set to be 150 μm or longer. The flow of current into the n-channel MOSFETs 241 and 242 is thereby suppressed.

The n-channel MOSFET 241 is a lateral MOSFET that includes a p-type base region 251, an $n^+$-type source region 252, a $p^+$-type contact region 253, a gate electrode 254, and an $n^+$-type drain region 255. Reference numerals "243", "244", and "245" respectively denote a high side driving circuit, a low side driving circuit, and a control circuit. The p-type base region 251 and the $p^+$-type contact region 253 respectively are the p-type diffusion region 211 and the $p^+$-type contact region 215 that constitute the HVJT 223. The $n^+$-type source region 252 is provided inside the p-type base region 251.

The $n^+$-type drain region 255 is provided inside the n-type diffusion region 203. A level shifting resistor 256 to be a diffusion resistor is formed by a portion between the $n^+$-type drain region 255 and the n-type contact region 212, of the n-type diffusion region 203. Some of the electrons flowing into the n-type diffusion region 203 of the U-phase flows into the pick-up electrode 214 and flows into the $n^+$-type drain region 255 through the level shifting resistor 256. Because the series resistance is increased in proportion to the length of the path for the electrons, the injection amount of the electrons flowing into the $n^+$-type drain region 255 is reduced.

SUMMARY OF THE INVENTION

According to an embodiment of the present invention, a semiconductor integrated circuit includes two or more first semiconductor regions of a first conductivity type selectively provided in a surface layer on a front surface of a semiconductor substrate so as to be separated from each other; a second semiconductor region of a second conductivity type selectively provided in each of the two or more first semiconductor regions, the second semiconductor region penetrating the two or more first semiconductor regions in a depth direction from the front surface of the semiconductor substrate; a third semiconductor region of the first conductivity type selectively provided in the each of the two or more first semiconductor regions so as to be separated from the second semiconductor region, a potential of the third semiconductor region being fixed at a potential higher than a potential of the second semiconductor region; and a high potential side circuit arranged to be closer to a central portion of the each of the two or more first semiconductor regions than the third semiconductor region is to the central portion. The third semiconductor region arranged in one first semiconductor region so as to be between the high potential side circuit in the one first-semiconductor-region and the high potential side circuit in an adjacent first-semiconductor-region, faces the high potential side circuit in the adjacent first semiconductor region across the third semiconductor region arranged in the adjacent first semiconductor region, without the second semiconductor region being between the third semiconductor region arranged in the one first semiconductor region and the third semiconductor region arranged in the adjacent first semiconductor region, the one first semiconductor region and the adjacent first semiconductor region being among the two or more first semiconductor regions and adjacent to each other.

In the embodiment, the second semiconductor region arranged in the one first semiconductor region is between the high potential side circuit of the one first semiconductor region and the high potential side circuit of a different first semiconductor region that is different from the adjacent first semiconductor region and adjacent to the one first semiconductor region, the second semiconductor region arranged in the one first semiconductor region faces the high potential side circuit of the different first semiconductor region across the second semiconductor region arranged in the different first semiconductor region, without the third semiconductor region being between the second semiconductor region arranged in the one first semiconductor region and the second semiconductor region arranged in the different first semiconductor region.

In the embodiment, the two or more first semiconductor regions have a rectangular planar shape, and along facing sides of at least one adjacent pair of the two or more first semiconductor regions, the third semiconductor region is arranged along each of the facing sides entirely without arrangement of the second semiconductor region.

In the embodiment, along facing sides of other adjacent first semiconductor regions among the two or more first semiconductor regions, the second semiconductor region is arranged along each of the facing sides entirely without arrangement of the third semiconductor region between the second semiconductor region and the second semiconductor region that face each other.

In the embodiment, the semiconductor integrated circuit further includes a fourth semiconductor region of the first conductivity type selectively provided in the surface layer on the front surface of the semiconductor substrate; and a low potential side circuit arranged in the fourth semiconductor region, the low potential side circuit operating at a reference voltage that is lower than that of the high potential side circuit. The fourth semiconductor region faces an outer periphery of the two or more first semiconductor regions at a part of the two or more first semiconductor region other than a part of the two or more first semiconductor regions in which the third semiconductor region is arranged.

In the embodiment, the semiconductor integrated circuit further includes a fourth semiconductor region of the first conductivity type selectively provided in the surface layer on the front surface of the semiconductor substrate; and a low potential side circuit arranged in the fourth semiconductor region, the low potential side circuit operating at a reference voltage that is lower than that of the high potential side circuit. The fourth semiconductor region is arranged between the two or more first semiconductor regions that are adjacent and have outer peripheries facing each other at a part of the two or more first semiconductor regions other than a part of the two or more first semiconductor regions in which the third semiconductor region is arranged.

In the embodiment, the first semiconductor region includes: a first first-semiconductor-region in which the high potential side circuit is formed; and a second first-semiconductor-region in contact with the first first-semiconductor-region, the second first-semiconductor-region surrounding the first first-semiconductor-region, an impurity concentration of the second first-semiconductor-region being lower than an impurity concentration of the first first-semiconductor-region.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 20A1 and 20A2 are perspective diagrams of configurations used in simulations for Example and Comparative Example;

FIGS. 20B1 and 20B2 are waveform diagrams of waveforms of noise applied to a first VB pick-up region of each of Example and Comparative Example of FIGS. 20A1 and 20A2;

FIGS. 20C1 and 20C2 are charts of injected current ratios of Example and Comparative Example of FIGS. 20A1 and 20A2;

DETAILED DESCRIPTION OF THE INVENTION

Figure 21:
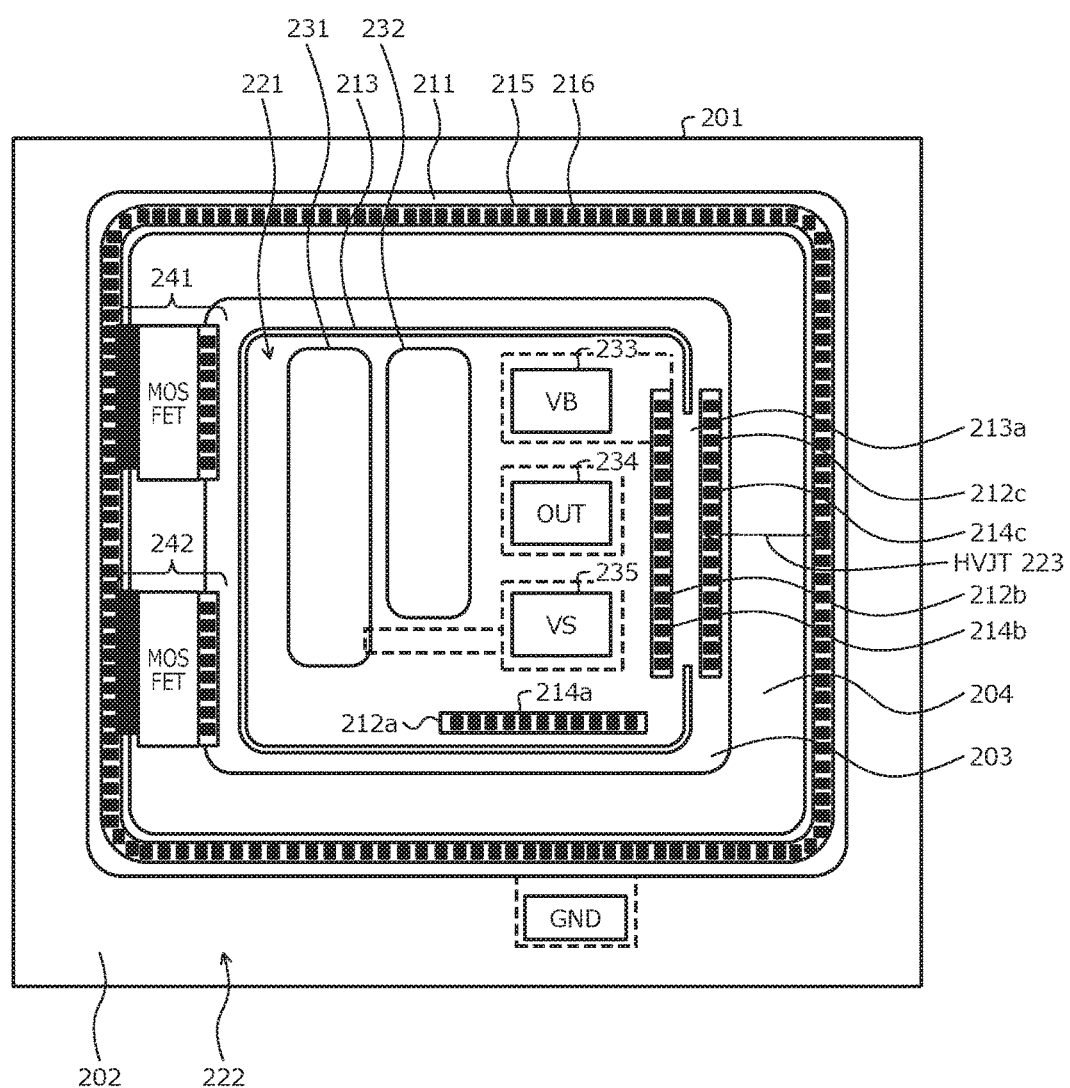
FIG. 21 is a plan diagram of a planar layout of a conventional HVIC.
Figure 22A:
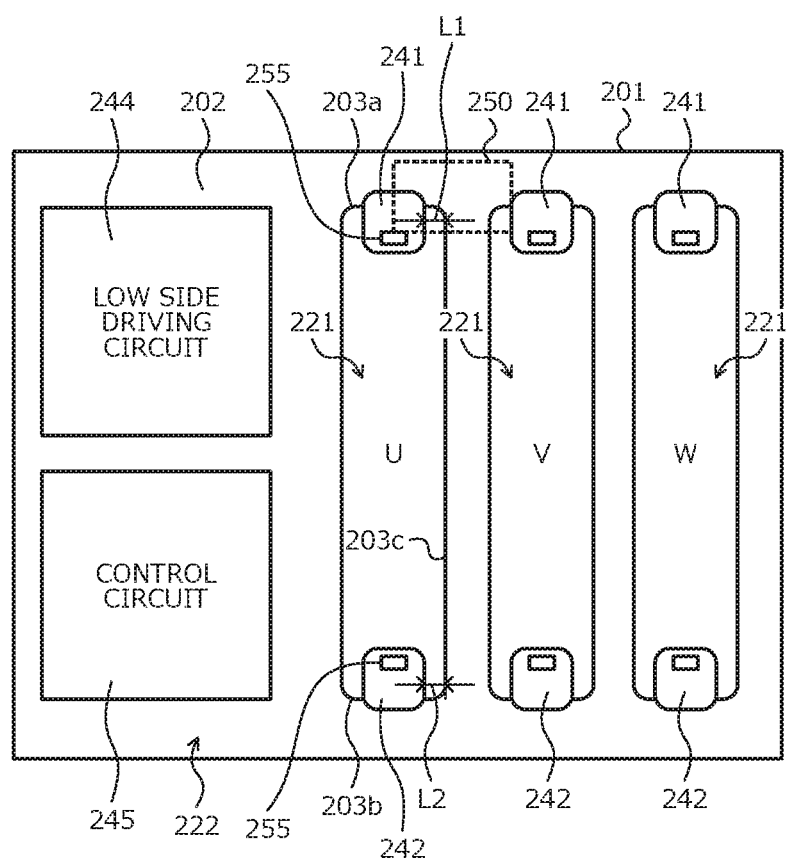
FIGS. 22A and 22B are plan diagrams of a planar layout of another example of a conventional HVIC.
Figure 22B:
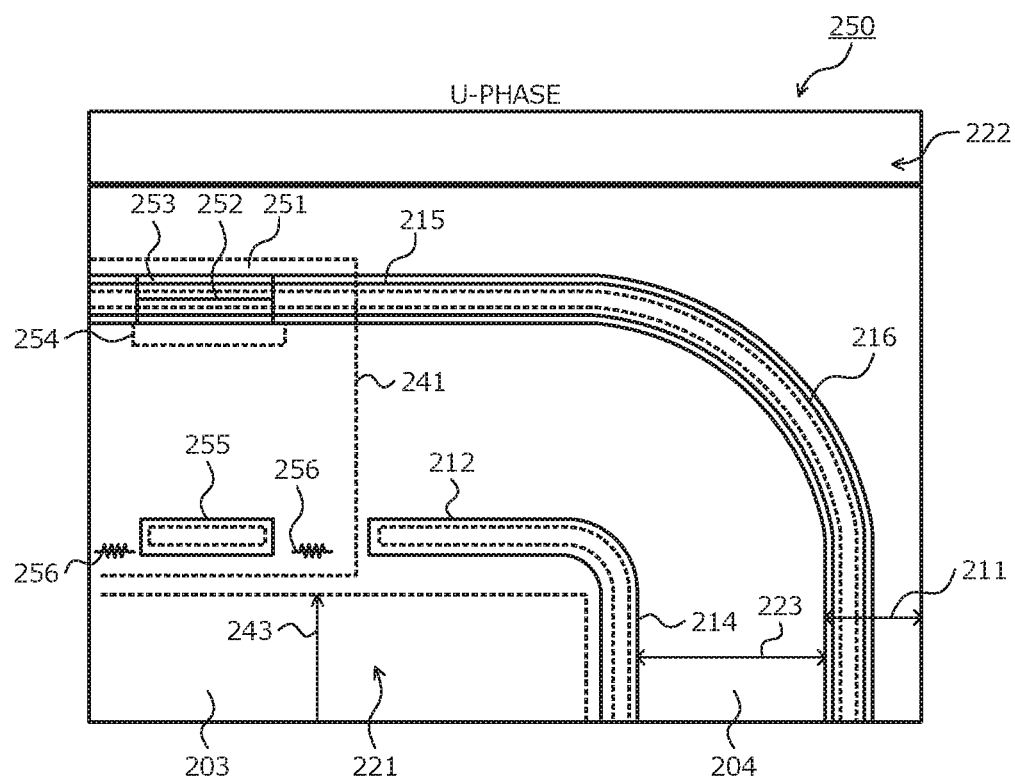

Nonetheless, to apply the HVIC depicted in FIG. 21 to the three-phase one-chip HVIC, the malfunction caused by interphase noise and occurring in the circuit unit in the one phase needs to be taken into consideration, and the HVIC depicted in FIG. 21 cannot simply be applied to the three-phase one-chip HVIC. In each of the phases of the three-phase one-chip HVIC, it is difficult to suppress malfunction of the circuit unit of the phase caused by the noise generated in the phase and to suppress malfunction of the circuit unit in the phase caused by interphase noise.

Embodiments of a semiconductor integrated circuit according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
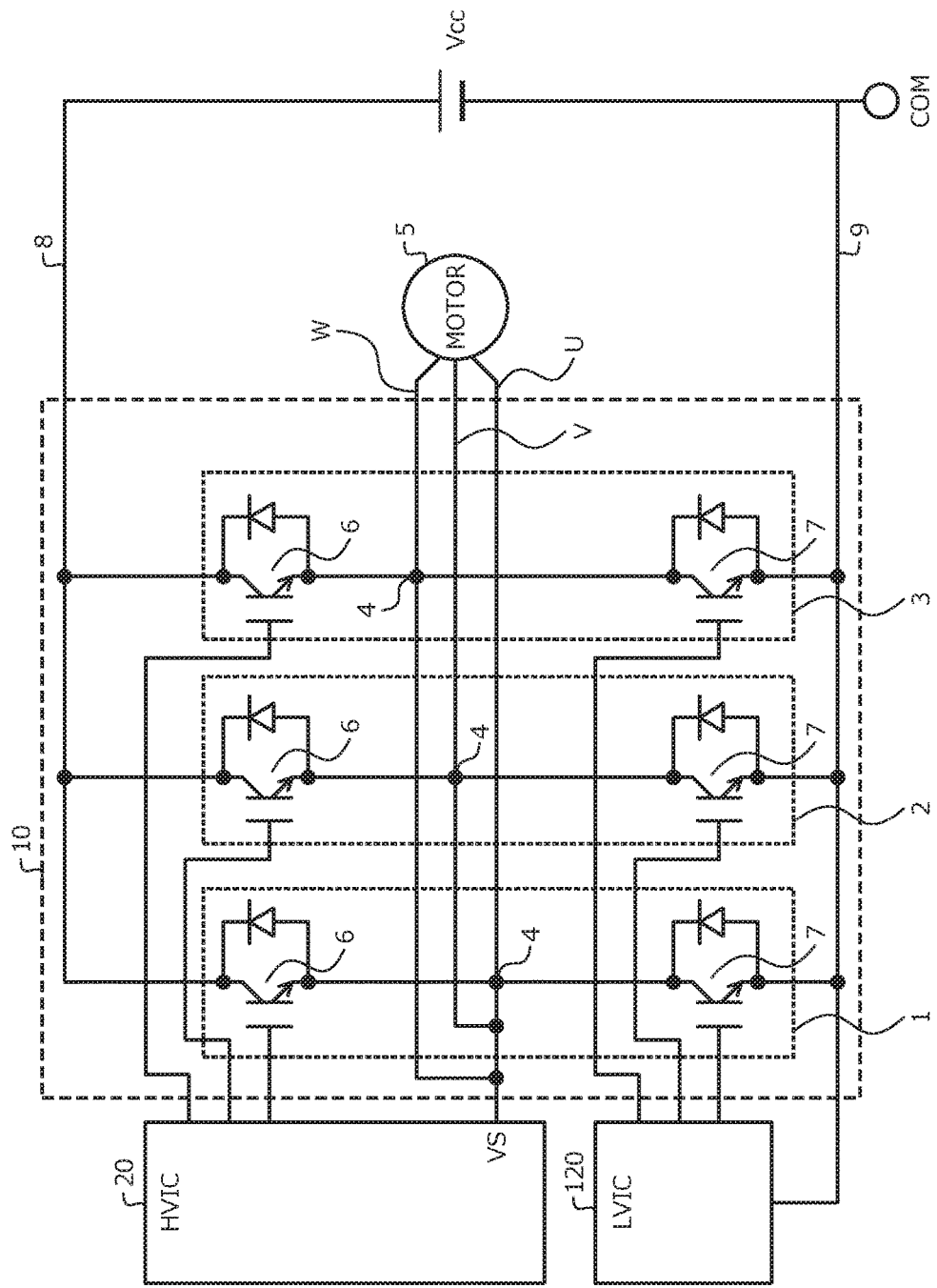
FIG. 1 is a circuit diagram of a circuit configuration of an ordinary three-phase inverter.

A structure of a semiconductor integrated circuit according to a first embodiment will be described taking an example of a case where the semiconductor integrated circuit according to the first embodiment is used as a gate driver IC that drives a three-phase inverter. A circuit configuration of an ordinary three-phase inverter will first be described. FIG. 1 is a circuit diagram of the circuit configuration of the ordinary three-phase inverter. As depicted in FIG. 1, the three-phase inverter 10 includes half-bridge circuits 1 to 3 of three phases (a U-phase, a V-phase, and a W-phase). Output points (a middle point) 4 of each of the half-bridge circuits 1 to 3 is connected to a load 5 such as a motor.

The half-bridge circuits 1 to 3 each includes an IGBT 6 on a high potential side (an upper arm) and an IGBT 7 on a low potential side (a lower arm) that are connected to each other in series and that are connected in parallel to each other between a high potential side (a high side) line 8 and a low potential side (a low side) line 9 of the three-phase inverter 10. The potential of the high potential side line 8 is a power source potential Vcc of the three-phase inverter 10 and the potential of the low potential side line 9 is a common potential COM. The "common potential COM" refers to the lowest potential that is common to the three-phase inverter 10 and an HVIC 20 and is, for example, a ground potential GND. A free wheeling diode (FWD) is connected in parallel to each of the IGBTs 6 and 7.

The connection point between the upper arm IGBT 6 and the lower arm IGBT 7 is the output point 4 of each of the half-bridge circuits 1 to 3, and is connected to a VS terminal of the high voltage integrated circuit (HVIC) 20. The HVIC 20 is a gate driver IC driving the IGBTs 6 in the upper arm constituting the three-phase inverter 10. The HVIC 20 is the semiconductor integrated circuit according to the first embodiment depicted in FIG. 3 described later. The potential of the VS terminal of the HVIC 20 varies between the power source potential Vcc of the three-phase inverter 10 and the common potential COM. A switching element such as a MOSFET may be used instead of each of the IGBTs 6 and 7. A low voltage integrated circuit (LVIC) 120 is a gate driver IC driving the IGBTs 7 in the lower arm that constitutes the three-phase inverter 10.

Figure 2:
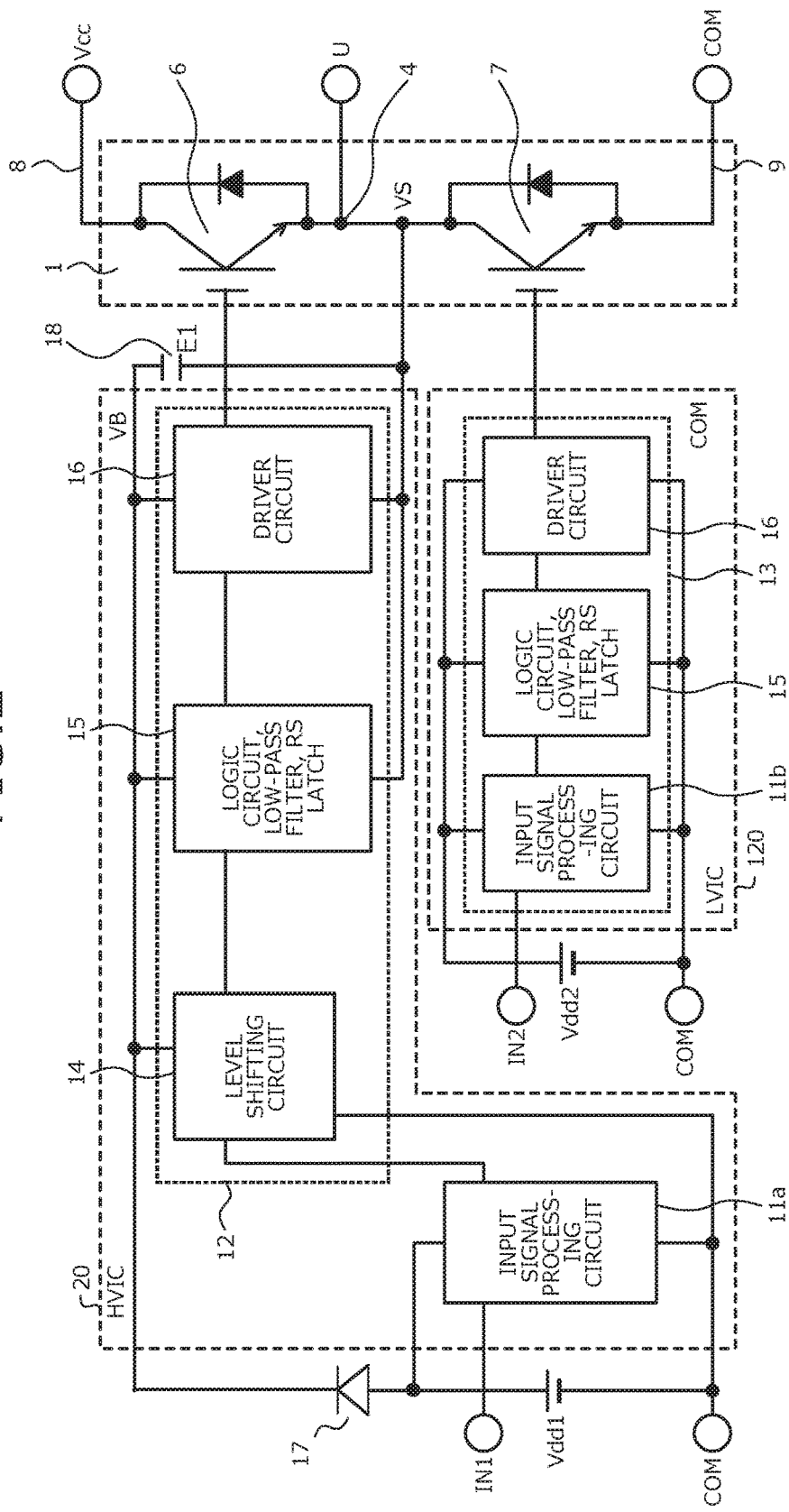
FIG. 2 is a block diagram of a circuit configuration of an ordinary HVIC.

An example of a circuit configuration of the HVIC 20 will be described. FIG. 2 is a block diagram of the circuit configuration of an ordinary HVIC. FIG. 2 depicts the half-bridge circuit 1 of the U-phase and the driving circuit unit thereof, among the half-bridge circuits 1 to 3 that constitute the three-phase inverter 10 of FIG. 1. Though not depicted, in each of the V-phase and the W-phase, the half-bridge circuit 1 and the driving circuit unit thereof respectively have the same circuit configurations as those of the half-bridge circuit 1 and the driving circuit unit in the U-phase.

The HVIC 20 includes, for each of the three phases, an input signal processing circuit 11a whose power source potential is a power source potential Vdd1 lower than the highest potential VB of a high side driving circuit 12, and the high side driving circuit 12 that drives the IGBT 6 in the upper arm of the half-bridge circuit 1. The input signal processing circuit 11a receives an input signal from an input terminal IN1 and outputs an on/off signal to the high side driving circuit 12.

The LVIC 120 includes, for each of the three phases, an input signal processing circuit 11b whose power source potential is a power source potential Vdd2 substantially equal to the power source potential Vdd1 of the HVIC 20, and a low side driving circuit 13 that drives the IGBT 7 in the lower arm. The LVIC 120 may be integrated on the single same semiconductor substrate (semiconductor chip) as that of the HVIC 20.

The high side driving circuit 12 operates using the potential VS of the output point (the middle point) 4 of the half-bridge circuit 1 as the reference potential and the highest potential VB of the high side driving circuit 12 (the highest potential of the HVIC 20) as the power source potential, and drives the IGBT 6 in the upper arm of the half-bridge circuit 1. The potential VS of the output point 4 of the half-bridge circuit 1 is lower than the highest potential VB of the high side driving circuit 12. The power source potential VB is the total of the potential VS and the high side power source potential. A voltage E1 charged from the power source potential Vdd1 to a bootstrap capacitor 18 through a bootstrap diode 17 is the high side power source. The low side driving circuit 13 operates using Vdd2 as the power source potential and the lowest potential (the ground potential GND) as the reference potential, and drives the IGBT 7 in the lower arm of the half-bridge circuit.

The high side driving circuit 12 includes a level shifting circuit 14. The high side driving circuit 12 and the low side driving circuit 13 each includes a driver circuit 16 and a circuit unit 15 that includes a logic circuit, a low-pass filter, an RS latch, and the like. The IGBT 6 receives an input of an on/off signal from the input terminal IN1, and is turned on/off by a gate signal input thereto through the input signal processing circuit 11a, the level shifting circuit 14, the circuit unit 15 that includes the logic circuit, the low-pass filter, the RS latch, and the like, and the driver circuit 16 of the HVIC 20. The IGBT 7 receives an input of an on/off signal from an input terminal IN2, and is turned on/off by a gate signal input thereto through the input signal processing circuit 11b, the circuit unit 15 that includes the logic circuit, the low-pass filter, the RS latch, and the like, and the driver circuit 16 of the LVIC 120.

Figure 3:
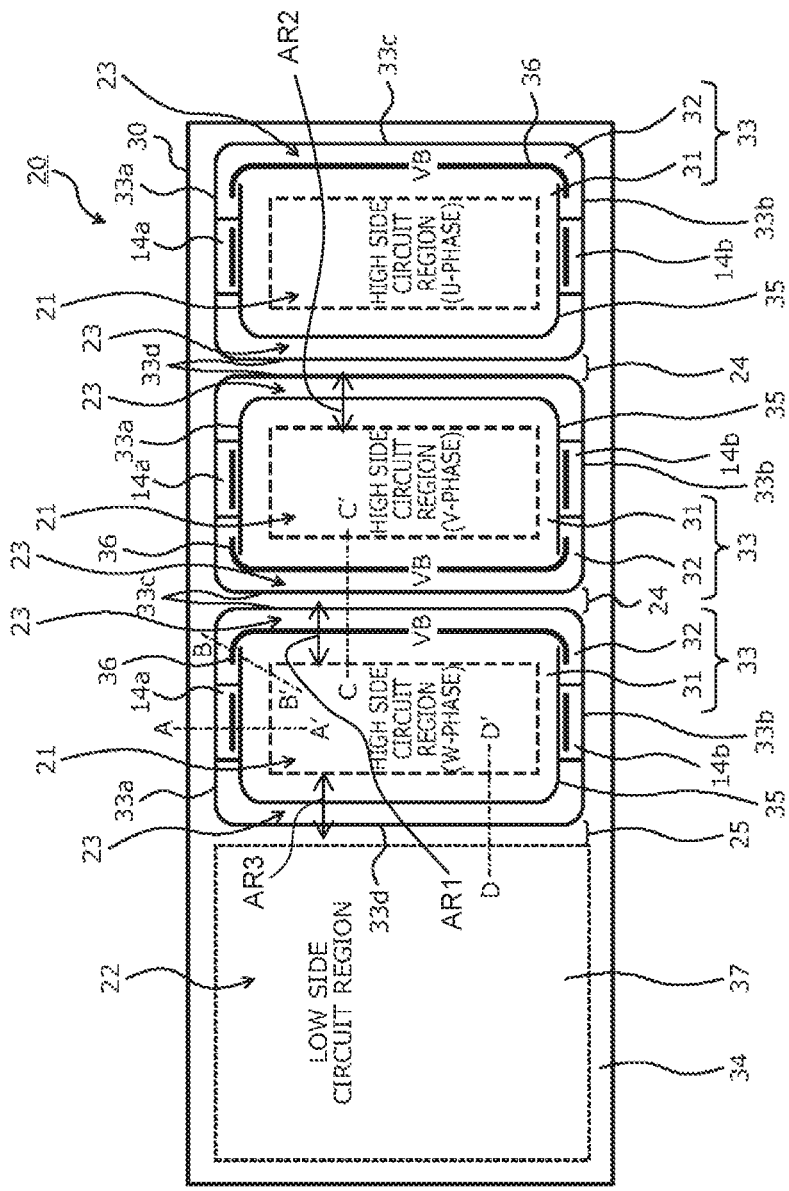
FIG. 3 is a plan diagram of a planar layout of a semiconductor integrated circuit according to a first embodiment.

A planar layout of the HVIC 20 will be described. FIG. 3 is a plan diagram of the planar layout of the semiconductor integrated circuit according to the first embodiment. The "planar layout" refers to the planar shapes and the configuration of the components as seen from the front surface side of the semiconductor substrate (the semiconductor chip) 30. The semiconductor integrated circuit according to the first embodiment depicted in FIG. 3 is the HVIC 20 to be the gate driver IC that drives the half-bridge circuits 1 to 3 in the three phases (the U-phase, the V-phase, and the W-phase) of the three-phase inverter 10. Each area in which one of the three phases of the three-phase inverter 10 is disposed may correspond to one of a plurality of first potential side areas. A first two adjacent first potential side areas may correspond to two areas in which the W-phase and the V-phase of the three-phase inverter 10 are respectively disposed. A second two adjacent first potential side areas may correspond to two areas in which the V-phase and the U-phase of the three-phase inverter 10 are respectively disposed.

The HVIC 20 includes a high side circuit region 21 and a low side circuit region 22 on the p⁻-type semiconductor substrate 30, and has a structure having these regions 21 and 22 separated from each other using a high voltage junction termination region (HVJT) 23. The two or more high side circuit regions 21 are arranged separated from each other. In each of the high side circuit regions 21, the high side driving circuit 12 for one phase (see FIG. 2) is arranged. In FIG. 3, the high side circuit regions 21 for the three phases (that is, three high side circuit regions 21) are arranged and the high side circuit regions 21 are denoted by the U-phase, the V-phase, and the W-phase (similarly in FIGS. 12, 13, 16, 17, and 19). The high side circuit regions 21 each includes an n-type diffusion region 33 different from that of each other (hereinafter, referred to as "n-type well region"). Each of the first two adjacent first potential side areas includes a first side area facing the other, and each first side area includes the third semiconductor region, and is free of the second semiconductor region. The first side area may correspond to an area AR1 of FIG. 3 between the high side circuit region 21 in the area in which the W-phase of the three-phase inverter 10 is disposed and the area in which the V-phase of the three-phase inverter 10 is disposed. Each of the second two adjacent first potential side areas includes a second side area facing the other, and each second side area includes the second semiconductor region, and is free of the third semiconductor region. The second side area may correspond to an area AR2 of FIG. 3 between the high side circuit region 21 in the area in which the V-phase of the three-phase inverter 10 is disposed and the area in which the U-phase of the three-phase inverter 10 is disposed. An area in which the low side circuit region 22 is disposed may correspond to a second potential side area. The area in which the low side circuit region 22 is disposed faces the area in which the W-phase of the three-phase inverter 10 is disposed. A third side area facing the area in which the low side circuit region 22 is disposed may correspond an area AR3 of FIG. 3 between the high side circuit region 21 of the W-phase and the area in which the low side circuit region 22 is disposed. The third side area includes the second semiconductor region, and is free of the third semiconductor region.

The n-type well region 33 for one phase includes one n-type diffusion region 31 and an n⁻-type diffusion region 32 surrounding the periphery thereof. The n-type diffusion regions 31 each have, for example, a substantially rectangular planar shape and are arranged to be separated from each other and in parallel to each other. The n-type diffusion regions 31 are each surrounded by the n⁻-type diffusion region 32. The n-type well regions 33 are each arranged to be separated from each other. A portion of the n-type well region 33 surrounded by a p-type separation region 35 described later is the high side circuit region 21. Peripheries of the n-type well regions 33 (that is, peripheries of the n⁻-type diffusion regions 32) is surrounded by a p-type diffusion region (well region) 34.

In the n⁻-type diffusion region 32, an HVJT 23 is formed by the pn-junction for the p-type diffusion region 34. The high side circuit region 21 and the low side circuit region 22 are self-isolation from each other by the HVJT 23. In the HVJT 23, high voltage n-channel MOSFETs (hereinafter, referred to as "HVNMOSs") 14a and 14b are arranged spanning from the n⁻-type diffusion region 32 to the p-type diffusion region 34. The HVNMOSs 14a and 14b are arranged along a pair of opposing sides 33a and 33b of the n-well region 33, the opposing sides 33a and 33b are perpendicular to a side 33c of the n-well region 33 along which a first VB pick-up region 36 described later is arranged, and the opposing sides 33a and 33b face each other sandwiching the high side circuit region 21 therebetween. The "interphase region 24" refers to the portion of the semiconductor substrate 30 sandwiched between the n-type well regions 33. The n-type well region 33, the p-type separation region 35, the first VB pick-up region 36 may correspond to first, second, and third semiconductor regions, respectively. The n-type diffusion regions 31 and the n⁻-type diffusion region 32 may correspond to one and an other first semiconductor regions, respectively, included in the first semiconductor region.

The flow of electron carriers from the high side circuit region 21 of another phase (for example, the V-phase) adjacent to the high side circuit region 21 of one phase (for example, the U-phase) into drain terminals of the HVN-MOSs 14a and 14b is suppressed by not arranging the HVNMOSs 14a and 14b along the side 33c along which the first VB pick-up region 36 is arranged. The amounts of the electron carriers flowing into the HVNMOSs 14a and 14b of the one phase is thereby equalized and malfunction of each of the HVNMOSs 14a and 14b of the one phase may be prevented. The HVNMOSs 14a and 14b constitute the level shifting circuit 14 and are respectively for setting (set) and resetting (reset) the high side driving circuit 12. The lateral lines in rectangles indicating the HVNMOSs 14a and 14b indicate gate electrodes of the HVNMOSs 14a and 14b.

In the n-type well region 33 (in this embodiment, the n⁻-type well region 32), the p-type separation region 35 and the first VB pick-up region 36 are each selectively provided along the outer periphery of the n-type well region 33 to be more outward than the high side circuit region 21. The p-type separation region 35 and the first VB pick-up region 36 are arranged to form one substantially annular planar layout so that the p-type separation region 35 and the first VB pick-up region 36 to surround the periphery of the high side circuit region 21. For each of the n-type well regions 33, a central portion side of the n-type well region 33 (the high side circuit region 21 side) is defined as an inner side, and the outer periphery side of the n-type well region 33 (the n⁻-type well region 32 side) is defined as an outer side.

For example, the p-type separation region 35 is provided in a C-shape planar layout that surrounds the periphery of the high side circuit region 21 along, for example, the outer periphery of the n-type well region 33 (in this embodiment, the three sides 33a, 33d, and 33b of the n-type well region 33) to extend between the high side circuit region 21 and the HVNMOSs 14a and 14b. The p-type separation region 35 electrically separates the high side circuit region 21 of one phase, and the other regions and the other circuit units (such as the high side circuit region 21 and the low side circuit region 22 of other phases, and the HVNMOSs 14a and 14b of the one phase) from each other. The p-type separation region 35 of the one phase has a function of, when a negative voltage surge occurs, acting as a potential barrier to suppress injection of holes into the high side circuit region 21 of the one phase. A depletion layer spreads inside the p-type separation region 35 when the highest potential VB of the high side driving circuit 12 becomes a high potential (for example, when the IGBT 6 is turned on in FIG. 1). The impurity concentration and the width of the p-type separation region 35 are set such that the depletion layer spreads at least to the extent that the depletion layer separates the p-type separation region 35 and the p⁻-type semiconductor substrate 30 from each other.

The first VB pick-up region 36 is an n⁺-type contact region that externally extracts (picks up) the highest potential VB of the high side driving circuit 12 arranged in the n-type well region 33 from the semiconductor substrate 30. The first VB pick-up region 36 surrounds the periphery of the high side circuit region 21 along the outer periphery of the n-type well region 33 (in this embodiment, the one side 33c of the n-type well region 33) at a location at which the p-type separation region 35 is not arranged. The first VB pick-up region 36 is arranged to be separated from the p-type separation region 35. For example, the first VB pick-up region 36 is arranged in a linear planar layout along the one side 33c in contact with the interphase region 24 located between the n-type well region 33 and the adjacent n-type well region 33, in the n-type well region 33. The first VB pick-up region 36 may have, for example, a substantially dotted-line planar layout that is formed by arranging linear portions at predetermined intervals on a straight line along the one side 33c in contact with the interphase region 24 located between the n-type well region 33 and the adjacent other n-type well region 33, in the n-type well region 33.

The first VB pick-up region 36 may be arranged in, for example, a substantially C-shape planar layout extending from the one side 33c in contact with the interphase region 24 located between the n-type well region 33 and the adjacent other n-type well region 33, in the n-type well region 33, to the two sides 33a and 33b perpendicular to the one side 33c. In this case, an end portion curved (or bent) along the sides 33a and 33b of the n-type well region 33, in the first VB pick-up region 36 may face an end portion of the p-type separation region 35 farther on the outer side than the end portion of the p-type separation region 35, in the n-type well region 33. The end portion of the first VB pick-up region 36 is terminated, for example, not to reach the HVNMOSs 14a and 14b. Each of the n-type well regions 33 has an outer periphery portion (in this embodiment, the one side 33c of the n-type well region 33) where the first VB pick-up region 36 is arranged and an outer periphery portion (in this embodiment, the three sides 33a, 33d, and 33b of the n-type well region 33) where the first VB pick-up region 36 is not arranged.

The first VB pick-up region 36 is arranged in each of the n-type well regions 33 such that the side 33c of the n-type well region 33 along which the first VB pick-up region 36 is arranged, (hereinafter, simply referred to as "side along which the first VB pick-up region 36 is arranged") faces the side 33c of the adjacent n-type well region 33 sandwiching therebetween at least the interphase region 24 (the p-type diffusion region 34). Of the three or more n-type well regions 33, for at least one pair of the adjacent n-type well regions 33, the sides 33c along which the first VB pick-up region 36 is arranged face each other. For each of the other pairs of the adjacent n-type well regions 33, the sides 33c along which the first VB pick-up region 36 is arranged face each other or the sides along which the first VB pick-up region 36 is not arranged (for example, the side 33d opposite the side 33c along which the first VB pick-up region 36 is arranged) face each other.

The flow of interphase noise (noise generated in another phase) into the high side circuit region 21 is inhibited by arranging the first VB pick-up region 36 as described above. For example, as depicted in FIG. 3, the n-type well regions 33 constituting the phases are arranged in parallel to each other in the order of the U-phase, the V-phase, and the W-phase. The sides 33d opposite the sides 33c along which the first VB pick-up region 36 is arranged, of the n-type well region 33 face each other sandwiching the interphase region 24 between the n-type well regions 33 constituting the U-phase and the V-phase. In addition, the reason why the flow of interphase noise into the high side circuit region 21 is inhibited will be described taking an example of the case where the sides 33c of the n-type well regions 33 constituting the V-phase and the W-phase (the sides 33c along which the first VB pick-up region 36 is arranged), face each other sandwiching the interphase region 24 between the n-type well regions 33 constituting the V-phase and the W-phase.

For example, it is assumed that noise (current) is generated near of the first VB pick-up region 36 arranged in the n-type well region 33 constituting the V-phase (hereinafter, referred to as "first VB pick-up region 36 of the V-phase"). In this case, the noise current (the interphase noise) unable to be fully absorbed by the p-type diffusion region 34 that is at the ground potential GND and arranged in the n-type well region 33 constituting the V-phase flows into the first VB pick-up region 36 of the other phase. At this time, the interphase noise mainly flows into the first VB pick-up region 36 of the W-phase because the sides 33c (along which the first VB pick-up region 36 is arranged) of the n-type well regions 33 face each other as described above at the interphase region 24 between the n-type well region 33 constituting the V-phase and the adjacent n-type well region 33 (in this case, the n-type well region 33 constituting the W-phase). The flow of the interphase noise into the HVN-MOSs 14a and 14b, and the high side circuit region 21 arranged in the n-type well region 33 constituting the W-phase may be suppressed, and a high noise capability immunity may be secured. On the other hand, as to the interphase region 24 between the n-type well region 33 constituting the V-phase and the other n-type well region 33 adjacent thereto (in this example, the n-type well region 33 constituting the U-phase), the sides 33d opposite the sides 33c along which the first VB pick-up region 36 is arranged, of the n-type well regions 33 face each other sandwiching the interphase region 24 therebetween. In this case, the flow of the interphase noise into the n-type well regions 33 on both sides of the interphase region 24 is difficult and therefore, a high noise capability immunity may be secured.

The second VB pick-up region (not depicted) may be arranged, for example, more inwardly than the p-type separation region 35 and the first VB pick-up region 36, of the n-type well region 33, to surround the circuit units constituting the high side driving circuit 12.

For example, the input signal processing circuit 11a of the HVIC 20 (see FIG. 2) is arranged in the low side circuit region 22. The low side circuit region 22 includes an n-type diffusion region 37. The periphery of the n-type diffusion region 37 is surrounded by the p-type diffusion region 34 and the n-type diffusion region 37 is arranged to be separated from the n-type well region 33. The n-type diffusion region 37 may correspond to a fourth semiconductor region. The n-type diffusion region 37 is arranged, for example, along the same single straight line as the n-type well regions 33 for the three phases. The n-type diffusion region 37 is arranged at a position so as to not face the side 33c along which the first VB pick-up region 36 is arranged, of the adjacent n-type well region 33. FIG. 3 depicts the case where the n-type diffusion region 37 is arranged to face the one side 33d along which the first VB pick-up region 36 is not arranged, in the n-type well region 33 that constitutes the W-phase.

The first VB pick-up region 36 is not arranged in the portion of the n-type well region 33, the portion that faces the n-type diffusion region 37 and sandwiches an interphase region 25 with the n-type diffusion region 37, as described above. When noise (current) is generated near the first VB pick-up region 36, further adverse effects of this interphase noise on the circuit unit arranged in the low side circuit region 22 may thereby be suppressed. The interphase region 24 between the n-type well regions 33, and the interphase region 25 between the n-type well region 33 and the n-type diffusion region 37 are electrically connected to a GND contact electrode through a p$^+$-type contact region (hereinafter, referred to as "COM contact region") not depicted, and the potential thereof is fixed at the ground potential GND.

Figure 4:
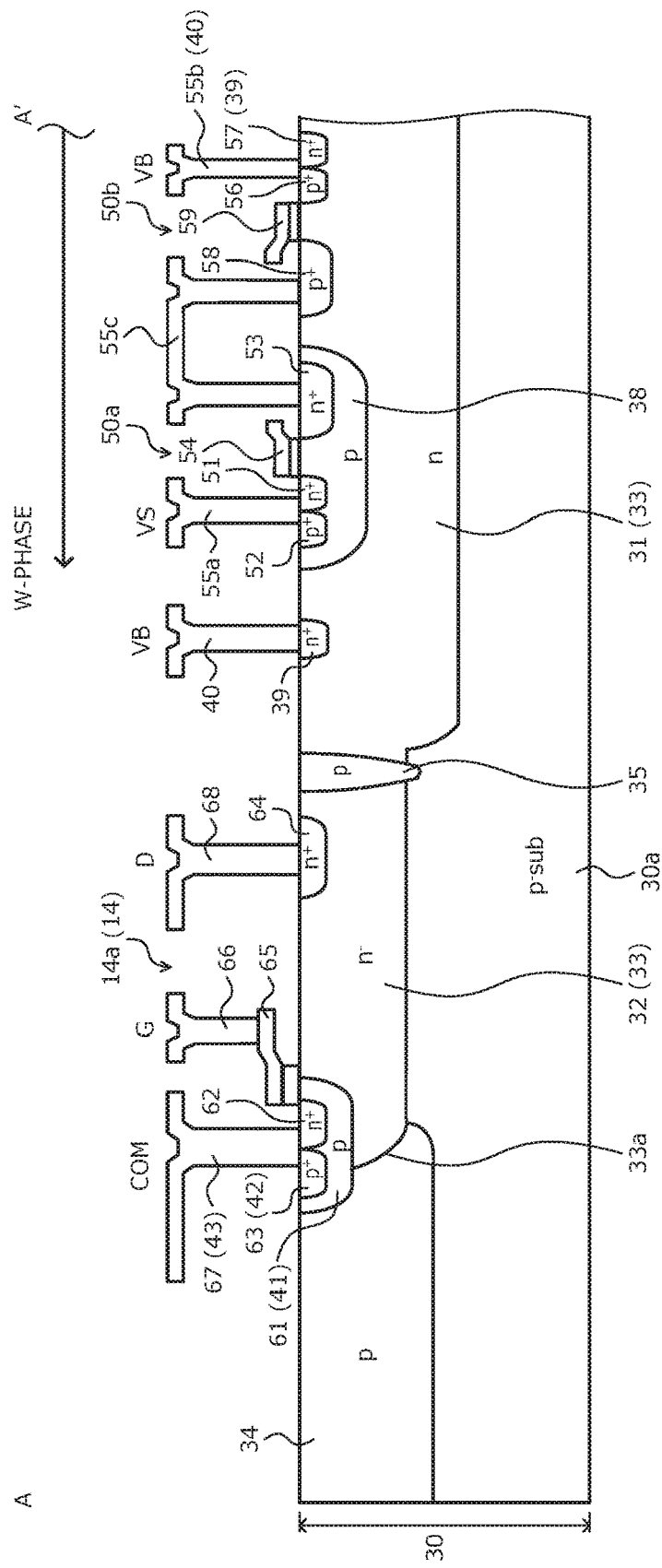
FIG. 4 is a cross-sectional view taken along a cutting line A-A' of FIG. 3.
Figure 5:
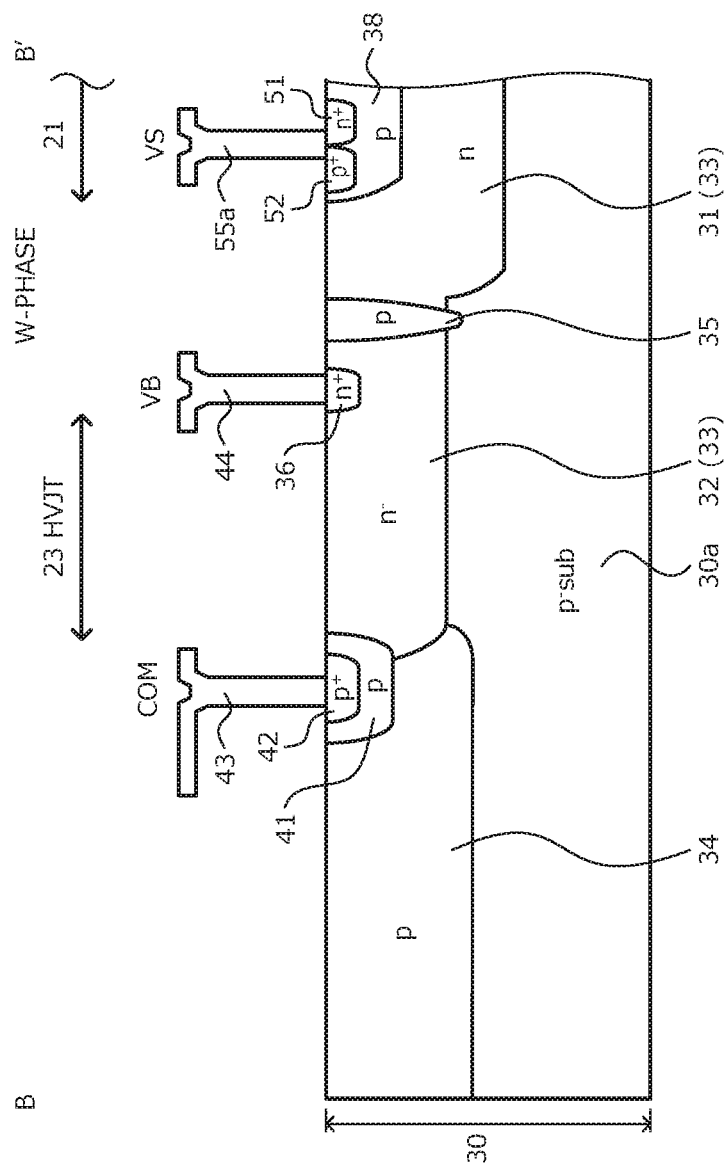
FIG. 5 is a cross-sectional view taken along a cutting line B-B' of FIG. 3.
Figure 6:
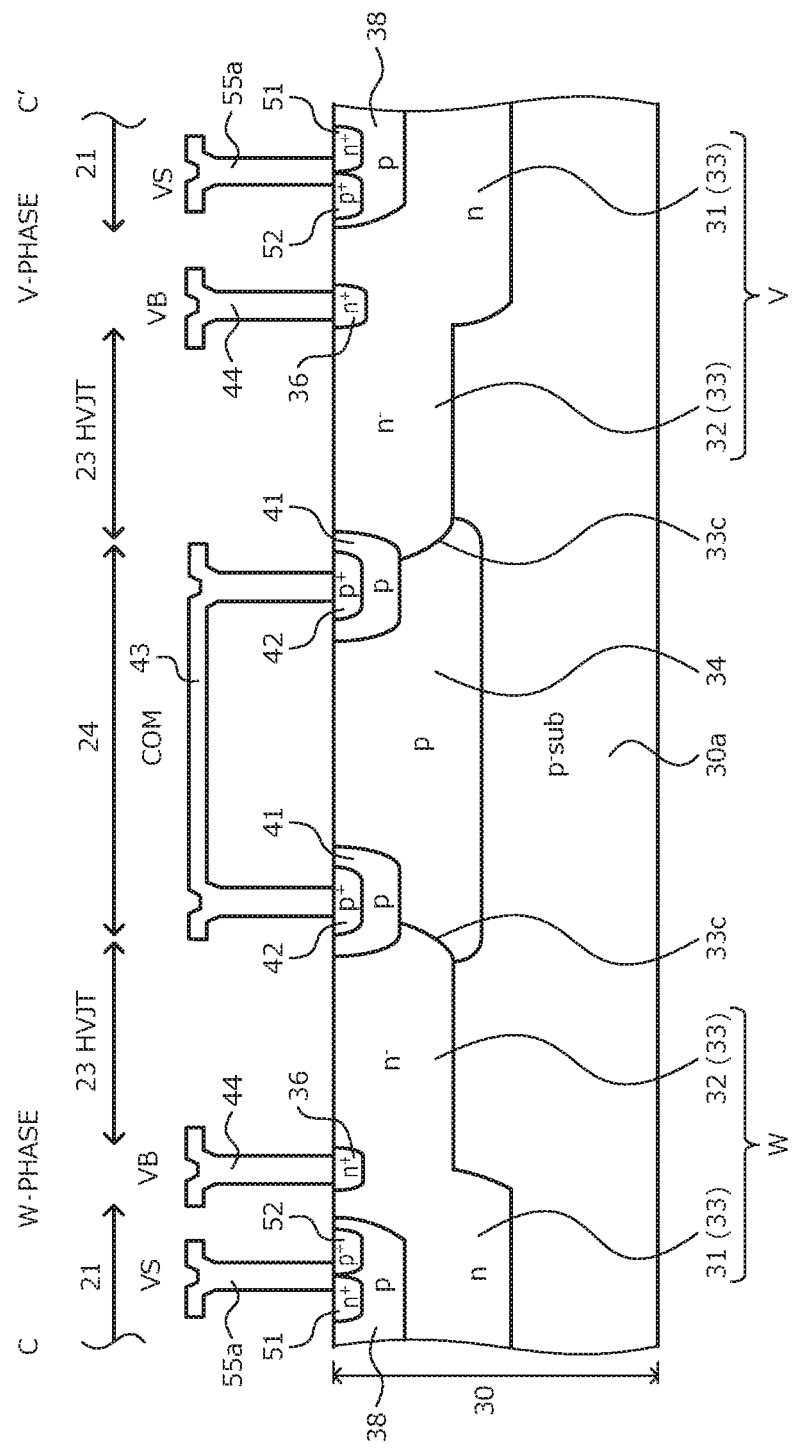
FIG. 6 is a cross-sectional view taken along a cutting line C-C' of FIG. 3.
Figure 7:
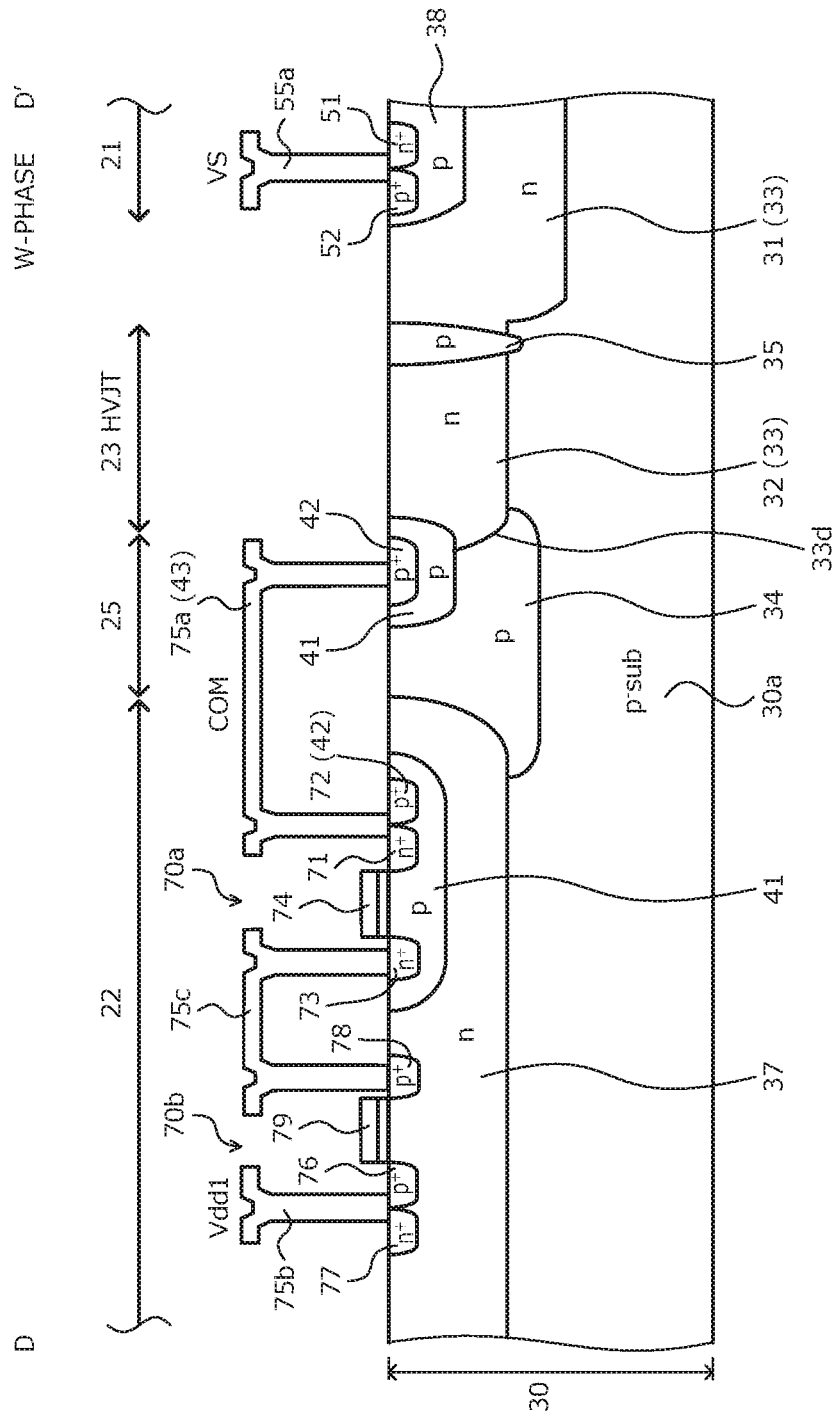
FIG. 7 is a cross-sectional view taken along a cutting line D-D' of FIG. 3.

A cross-sectional structure of the semiconductor integrated circuit according to the first embodiment will be described. FIG. 4 is a cross-sectional view taken along a cutting line A-A' of FIG. 3. FIG. 5 is a cross-sectional view taken along a cutting line B-B' of FIG. 3. FIG. 6 is a cross-sectional view taken along a cutting line C-C' of FIG. 3. FIG. 7 is a cross-sectional view taken along a cutting line D-D' of FIG. 3. FIGS. 4 to 7 depict the cross-sectional structures each taken by cutting the n-type well region 33 of the W-phase, among the n-type well regions 33 of the three phases depicted in FIG. 3. The U-phase and the V-phase also have the same cross-sectional structure as that of the W-phase.

As depicted in FIG. 4, the n-type diffusion region 31, the n$^-$-type diffusion region 32, the p-type diffusion region 34, and the p-type separation region 35 are each selectively provided in the surface layer on the front side of the p$^-$-type semiconductor substrate 30 (the front surface of the substrate). The n$^-$-type diffusion region 32 is in contact with the n-type diffusion region 31 and surrounds the periphery of the n-type diffusion region 31. The depth of the n$^-$-type diffusion region 32 may be, for example, shallower than the depth of the n-type diffusion region 31. The p-type diffusion region 34 is in contact with the n$^-$-type diffusion region 32 and surrounds the periphery of the n$^-$-type diffusion region 32. The depth of the p-type diffusion region 34 may be deeper than that of the n$^-$-type diffusion region 32. The p-type separation region 35 penetrates the n-type well region 33 in the depth direction from the front surface of the substrate and reaches a p-type region 30a toward the rear surface side of the substrate.

The n-type well region 33 is a region that includes the n-type diffusion region 31 and the n$^-$-type diffusion region 32 surrounding the periphery thereof, as one combination. In a portion of the p$^-$-type semiconductor substrate, deeper than the regions 31, 32, and 34 from the front surface of the substrate 30, the regions 31, 32, and 34 are not formed, whereby the portion remains as a p-type region and is the p-type region 30a toward the rear surface side of the substrate. The "depth direction" refers to the direction perpendicular to the principal surface of the semiconductor substrate 30 (the longitudinal direction of FIGS. 4 to 7). The p-type diffusion region 34 and the p-type separation region 35 may each be a portion of the p$^-$-type semiconductor substrate 30 remaining in a slit-like shape inside the n-type well region 33 to be exposed from the p-type region 30a on the rear surface side of the substrate to the front surface side of the substrate.

The potential of the p-type separation region 35 is fixed at a potential equal to the potential of the semiconductor substrate 30 (the ground potential GND). A second VB pick-up region 39 is selectively provided in the surface layer on the front surface side of the substrate, in the portion of the n-type well region 33 surrounded by the p-type separation region 35 (in this example, the n-type diffusion region 31). The portion of the n-type well region 33 surrounded by the p-type separation region 35 is electrically connected to a contact electrode 40 at the highest potential VB (hereinafter, referred to as "VB pick-up electrode") of the high side driving circuit 12 through the second VB pick-up region 39, and the potential of the portion is fixed at the highest potential VB. The portion of this n-type well region 33 surrounded by the p-type separation region 35 constitutes the high side circuit region 21 of one phase.

In the high side circuit region 21, circuit units that constitute the high side driving circuit 12 (the circuit unit 15 including a logic circuit, a low-pass filter, an RS latch, and the like, and the driver circuit 16: see FIG. 2) are arranged. FIG. 4 depicts, for example, a complementary MOS (CMOS) circuit that operates using the highest potential VB of the high side driving circuit 12 as the power source potential and operates using the emitter potential VS of the IGBT 6 in the upper arm of a power converting bridge circuit as the reference potential. The CMOS circuit includes a lateral n-channel MOSFET (hereinafter, referred to as "lateral NMOS") 50a and a lateral p-channel MOSFET (hereinafter, referred to as "lateral PMOS") that are complementarily connected to each other.

The lateral NMOS 50a is arranged in a p-type diffusion region 38 that is selectively provided inside the n-type diffusion region 31. The lateral NMOS 50a is an ordinary planar gate MOSFET that includes an $n^+$-type source region 51, a $p^+$-type contact region 52, an $n^+$-type drain region 53, and a gate electrode 54 and that uses the p-type diffusion region 38 as a base region. The potential of each of the $n^+$-type source region 51 and the $p^+$-type contact region 52 of the lateral NMOS 50a is fixed at the reference potential of the high side driving circuit 12 (the emitter potential VS of the IGBT 6 in the upper arm) through the source electrode 55a.

The lateral PMOS 50b is arranged in the n-type diffusion region 31. The lateral PMOS 50b is an ordinary planar gate MOSFET that includes a $p^+$-type source region 56, an $n^+$-type contact region 57, a $p^+$-type drain region 58, and a gate electrode 59 and that uses the n-type diffusion region 31 as a base region. The potential of each of the $p^+$-type source region 56 and the $n^+$-type contact region 57 of the lateral PMOS 50b is fixed at the highest potential VB of the high side driving circuit 12 through the source electrode 55b. The $n^+$-type drain region 53 of the lateral NMOS 50a and the $p^+$-type drain region 58 of the lateral PMOS 50b are electrically connected to a drain electrode 55c.

The drain electrode 55c common to the lateral NMOS 50a and the lateral PMOS 50b is an output terminal of the high side driving circuit 12, that outputs an output signal to the gate of the IGBT 6 in the upper arm. The second VB pick-up region 39 and the VB pick-up electrode 40 also act respectively as the $n^+$-type contact region 57 and the source electrode 55b of the lateral PMOS 50b. The second VB pick-up region 39 is provided in the high side circuit region 21 so as to surround a periphery of the circuit units (such as the COMS circuits) constituting the high side driving circuit 12.

In the surface layer on the front surface side of the substrate of the $n^-$-type diffusion region 32 and the p-type diffusion region 34, a p-type diffusion region (hereinafter, referred to as "COM region") 41 is selectively provided to extend over the $n^-$-type diffusion region 32 and the p-type diffusion region 34. Inside the COM region 41, a $p^+$-type contact region (a COM contact region) 42 is selectively provided. The COM contact region 42 is electrically connected to a COM contact electrode 43 at the common potential COM. The p-type diffusion region 34, the COM region 41, and the COM contact region 42 each have a function of fixing the potential of the semiconductor substrate 30 at the common potential COM on the front surface side of the semiconductor substrate 30 and thereby, suppress fluctuation of the common potential COM.

In the $n^-$-type diffusion region 32, the HVJT 23 is formed by the pn-junction formed with the p-type diffusion region 34. In the HVJT 23, the HVNMOSs 14a and 14b that constitute the level shifting circuit 14 are arranged. The HVNMOS 14a is a lateral n-channel MOSFET that includes a p-type base region 61, an $n^+$-type source region 62, a $p^+$-type contact region 63, an $n^+$-type drain region 64, and a gate electrode 66, and that uses the $n^-$-type diffusion region 32 as an $n^-$-type drift region. The COM region 41, the COM contact region 42, and the COM contact region 43 also respectively act as the p-type base region 61, the $p^+$-type contact region 63, and a source electrode 67 of the HVNMOS 14a.

The $n^+$-type source region 62 is selectively provided inside the p-type base region 61. The $n^+$-type drain region 64 is selectively provided in the surface layer on the front surface side of the substrate of the $n^-$-type diffusion region 32. A gate polysilicon layer 65 is provided on the surface of the portion of the p-type base region 61 sandwiched by the $n^+$-type source region 62 and the $n^-$-type diffusion region 32 (the $n^-$-type drift region), via a gate insulating film. The gate polysilicon layer 65 is electrically connected to the gate electrode 66. The source electrode 67 is electrically connected to the $n^+$-type source region 62 and the $p^+$-type contact region 63. A drain electrode 68 is electrically connected to the $n^+$-type drain electrode 64. Though not depicted, the HVNMOS 14b has the same configuration as that of the HVNMOS 14a.

As depicted in FIG. 6, in the surface layer on the front surface side of the substrate, in each of the n-type well regions 33, the first VB pick-up region 36 is selectively provided between the high side circuit region 21 and the interphase region 24 located between the adjacent n-type well regions 33. The first VB pick-up region 36 is arranged to be separated from the p-type separation region 35, the p-type diffusion region 38, and the COM region 41. The portion of the n-type well region 33 between the high side circuit region 21 and the interphase region 24 is electrically connected to the VB pick-up electrode 44 through the first VB pick-up region 36, and the potential of the portion is fixed at the highest potential VB of the high side driving circuit 12.

The first VB pick-up region 36 may extend from the one side 33c of the n-type well region 33 in contact with the interphase region 24 between the n-type well region 33 and the adjacent n-type well region 33, to a vertex common to the sides 33a and 33b that are perpendicular to the side 33c (see FIG. 5). At the vertex common to the sides 33a and 33b perpendicular to the side 33c, the first VB pick-up region 36 may face the p-type separation region 35 sandwiching the n-type well region 33 therebetween. FIG. 5 depicts a cross-sectional view near the vertex that is common to the one side 33c and the one side 33a perpendicular to the side 33c of the n-type well region 33.

As depicted in FIG. 7, the n-type diffusion region 37 is selectively provided to be in contact with the p-type diffusion region 34 in the surface layer of the front surface of the $p^-$-type semiconductor substrate 30. The depth of the n-type diffusion region 37 may be shallower than the depth of the p-type diffusion region 34. In the interphase region 25 between the n-type well region 33 and the n-type diffusion region 37, in the surface layer on the front surface side of the substrate of the n-type well region 33 (the $n^-$-type diffusion region 32) and the p-type diffusion region 34, the COM region 41 is selectively provided to extend over the $n^-$-type diffusion region 32 and the p-type diffusion region 34. The COM region 41 is also selectively provided in the surface layer on the front surface side of the substrate in the portion of the n-type well region 37 facing the interphase region 25 between the n-type diffusion region 37 and the n-type well region 33.

The COM region 41 in the vicinity of the interphase region 25 between the n-type well region 33 and the n-type diffusion region 37 is also electrically connected to the COM contact electrode 43 through the COM contact region 42, and the potential thereof is fixed at the common potential COM. The n-type diffusion region 37 constitutes the low side circuit region 22. In the low side circuit region 22, the input signal processing circuit 11a is arranged. FIG. 7 depicts, as the circuit unit of the input signal processing circuit 11a, a CMOS circuit that operates using the power source potential Vdd1 that is lower than the highest potential VB of the high side driving circuit 12 as the power source potential and operates using the common potential COM as the reference potential.

The CMOS circuit is a CMOS circuit that includes a lateral NMOS 70a and a lateral PMOS 70b that are complementarily connected to each other. The lateral NMOS 70a is arranged in the COM region 41 that is provided inside the n-type diffusion region 37. The lateral NMOS 70a is an ordinary planar gate MOSFET that includes an $n^+$-type source region 71, a $p^+$-type contact region 72, an $n^+$-type drain region 73, and a gate electrode 74, and that uses the COM region 41 as a base region. The potential of each of the $n^+$-type source region 71 and the $p^+$-type contact region 72 of the lateral NMOS 70a is fixed at the common potential COM through the source electrode 75a.

The lateral PMOS 70b is arranged in the n-type diffusion region 37. The lateral PMOS 70b is an ordinary planar gate MOSFET that includes a $p^+$-type source region 76, an $n^+$-type contact region 77, a $p^+$-type drain region 78, and a gate electrode 79, and that uses the n-type diffusion region 37 as a base region. The potential of each of the $p^+$-type source region 76 and the $n^+$-type contact region 77 of the lateral PMOS 70b is fixed at the power source potential Vdd1 of the input signal processing circuit 11a of the HVIC 20 through the source electrode 75b. The $n^+$-type drain region 73 of the lateral NMOS 70a and the $p^+$-type drain region 78 of the lateral PMOS 70b are electrically connected to the drain electrode 75c.

The drain electrode 75c common to the lateral NMOS 70a and the lateral PMOS 70b is an input terminal of the low side circuit unit that receives a signal input to the gate of the CMOS circuit (not depicted) that is on the low side and connected to the level-up level shifting circuit. The COM contact region 42 and the COM contact electrode 43 also act respectively as the $p^+$-type contact region 72 and the source electrode 75a of the lateral PMOS 70b. The COM contact region 42 is also provided in the interphase region 25 between the n-type well region 33 and the n-type diffusion region 37.

As described above, according to the first embodiment, the p-type separation region is provided at the periphery of the high side circuit region, in the n-type well region constituting the high side circuit region. When a negative voltage surge occurs in the n-type well region of one phase, the p-type separation region of the one phase thereby acts as a potential barrier and the injection of holes to the high side circuit region of the one phase is suppressed. Therefore, malfunction caused by noise generated in the one phase may be suppressed. According to the first embodiment, the first VB pick-up region is arranged along the outer periphery of the n-type well region at a location at which the p-type separation region is not arranged, in the n-type well region. In addition, between the adjacent n-type well regions, the sides along which the first VB pick-up region is arranged or the sides along which the first VB pick-up region is not arranged are caused to face each other. Among the sides of the adjacent n-type well regions, the respective sides along which the first VB pick-up region is arranged are caused to face each other as described above, whereby noise that is not fully absorbed by the p-type separation region and flows to another phase (interphase noise: noise generated in one phase and going to another phase) may be absorbed mainly by the first VB pick-up region of the other phase. Further, among the sides of the adjacent n-type well regions, the sides along which the first VB pick-up region is not arranged are caused to face each other, whereby the flow of interphase noise into the interphase region between the n-type well regions is inhibited. Malfunction caused by the interphase noise may be suppressed.

Figure 8:
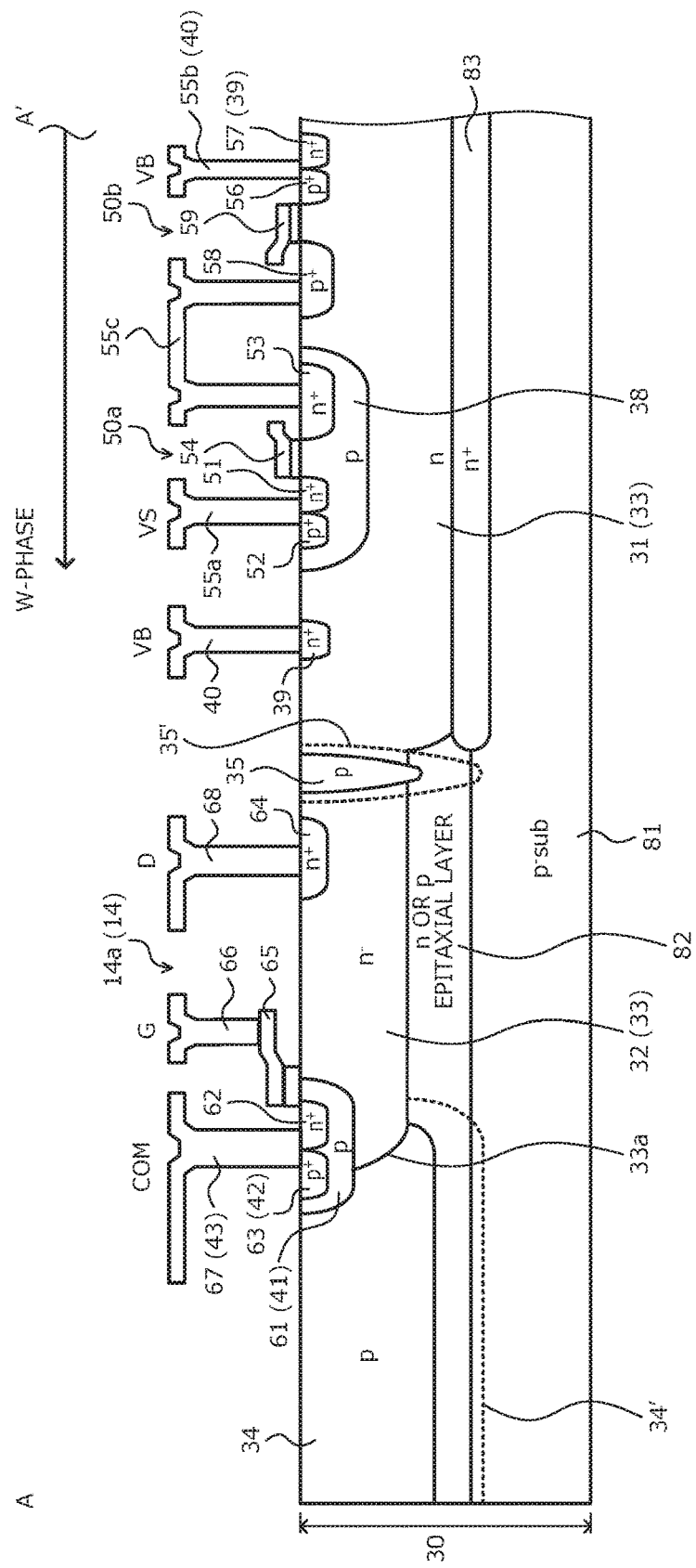
FIG. 8 is a cross-sectional view taken along the cutting line A-A' of FIG. 3.
Figure 9:
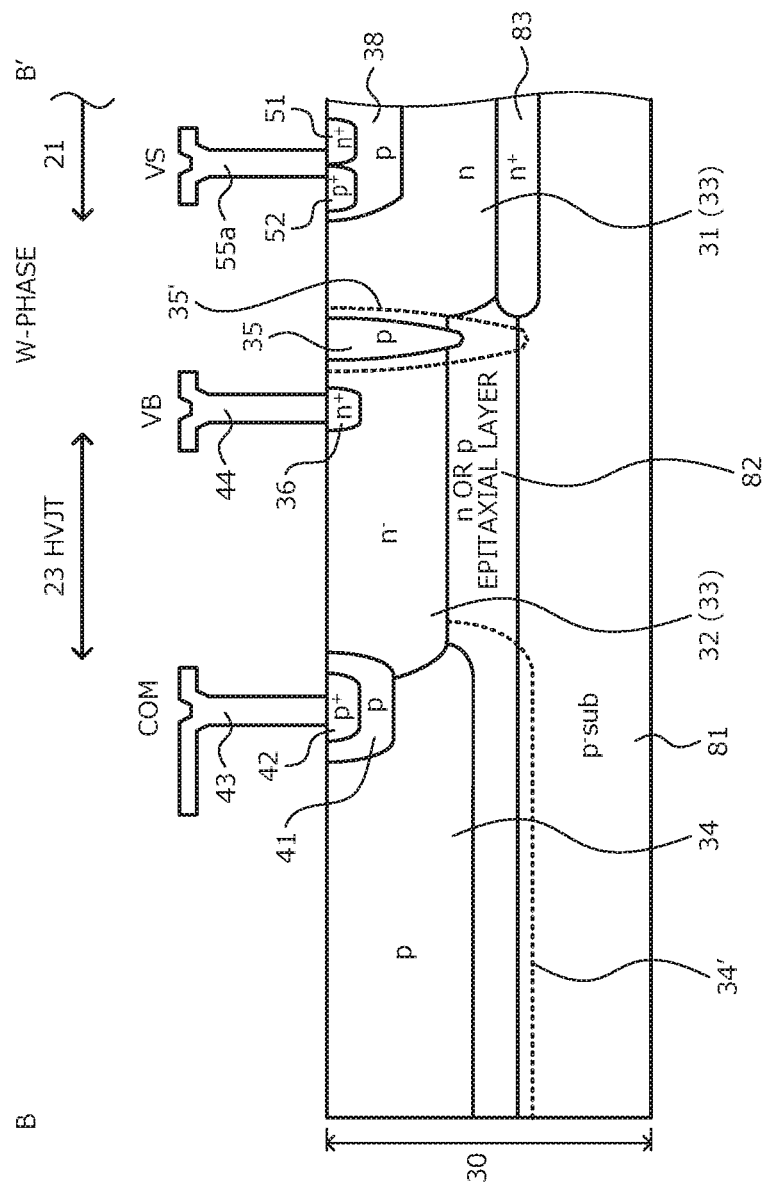
FIG. 9 is a cross-sectional view taken along the cutting line B-B' of FIG. 3.
Figure 10:
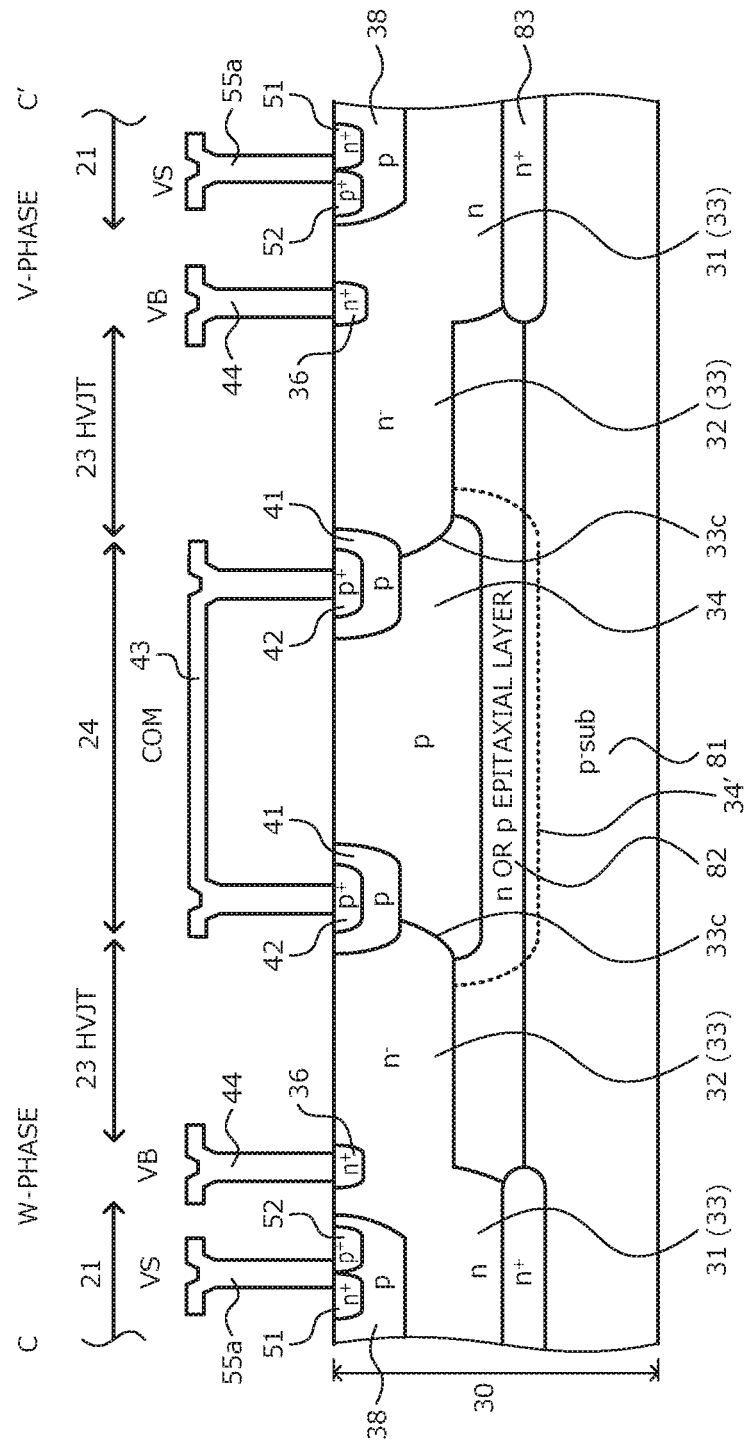
FIG. 10 is a cross-sectional view taken along the cutting line C-C' of FIG. 3.
Figure 11:
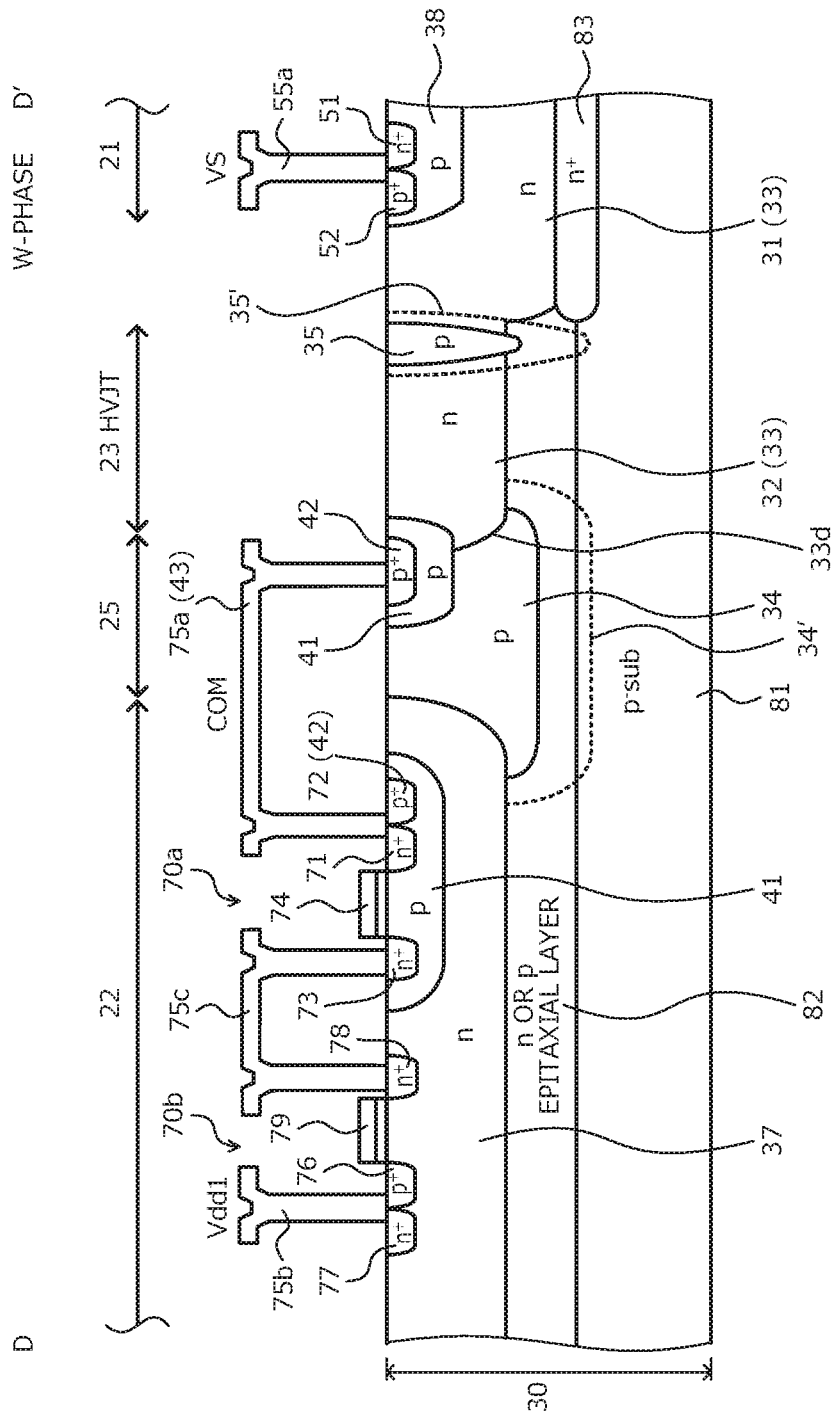
FIG. 11 is a cross-sectional view taken along the cutting line D-D' of FIG. 3.

The structure of a semiconductor integrated circuit according to a second embodiment will be described. FIGS. 8, 9, 10, and 11 are cross-sectional diagrams of the structure of the semiconductor integrated circuit according to the second embodiment. FIG. 8 is a cross-sectional view taken along the cutting line A-A' of FIG. 3. FIG. 9 is a cross-sectional view taken along the cutting line B-B' of FIG. 3. FIG. 10 is a cross-sectional view taken along the cutting line C-C' of FIG. 3. FIG. 11 is a cross-sectional view taken along the cutting line D-D' of FIG. 3. FIGS. 8 to 11 depict the cross-sectional structures each taken by cutting the n-type well region 33 in the W-phase, among the n-type well regions 33 of the three phases depicted in FIG. 3. The U-phase and the V-phase also have the same cross-sectional structure as that of the W-phase.

The semiconductor integrated circuit according to the second embodiment differs from the semiconductor integrated circuit according to the first embodiment on the following two points. The first point is that an epitaxial substrate that is formed by growing an n-type or a p-type epitaxial layer 82 on a $p^-$-type supporting substrate 81 is used as the semiconductor substrate 30. The second point is that an $n^+$-type embedded layer 83 is provided between the portion of the n-type well region 33 constituting the high side circuit region 21 (in this embodiment, the n-type diffusion region 31) and the $p^-$-type supporting substrate 81, the $n^+$-type embedded layer 83 being provided so as to be in contact with the n-type well region 33 and the $p^-$-type supporting substrate 81.

The n-type diffusion region 31, the $n^-$-type diffusion region 32, the p-type diffusion region 34, the p-type separation region 35, and the n-type diffusion region 37 are each selectively provided in a same manner as in the first embodiment, in the surface layer of the epitaxial layer 82, on the substrate front surface side (the side opposite the $p^-$-type supporting substrate 81 side) of the epitaxial layer 82. The arrangement of the diffusion regions provided in the n-type diffusion region 31, the $n^-$-type diffusion region 32, the p-type diffusion region 34, and the n-type diffusion region 37, and the electrode structure on the front surface of the semiconductor substrate 30 is similar to the arrangement in the first embodiment.

In the case of the n-type epitaxial layer 82, as indicated by a dotted line 35' and a dotted line 34', the p-type separation region 35 and the p-type diffusion region 34 are arranged to penetrate the n-type well region 33 (in this embodiment, the $n^-$-type diffusion region 32) and the n-type epitaxial layer 82 in the depth direction from the front surface of the substrate to reach the $p^-$-type supporting substrate 81. In the case of the n-type epitaxial layer 82, the high side circuit region 21, the low side circuit region 22, the HVNMOSs 14a and 14b, and the like may be arranged in the epitaxial layer 82 without providing the n-type diffusion region 31, the $n^-$-type diffusion region 32, and the n-type diffusion region 37. When the high side circuit region 21 and the low side circuit region 22 are formed in the epitaxial layer 82, the $n^+$-type embedded layer 83 and the epitaxial layer 82 provided immediately thereon correspond to a first first-semiconductor-region. In the case of the p-type epitaxial layer 82, the p-type diffusion region 34 and the p-type separation region 35 may be constituted by a portion of the epitaxial layer 82.

As described above, according to the second embodiment, effect similar to those of the first embodiment may be achieved even when the epitaxial substrate is used.

Figure 12:
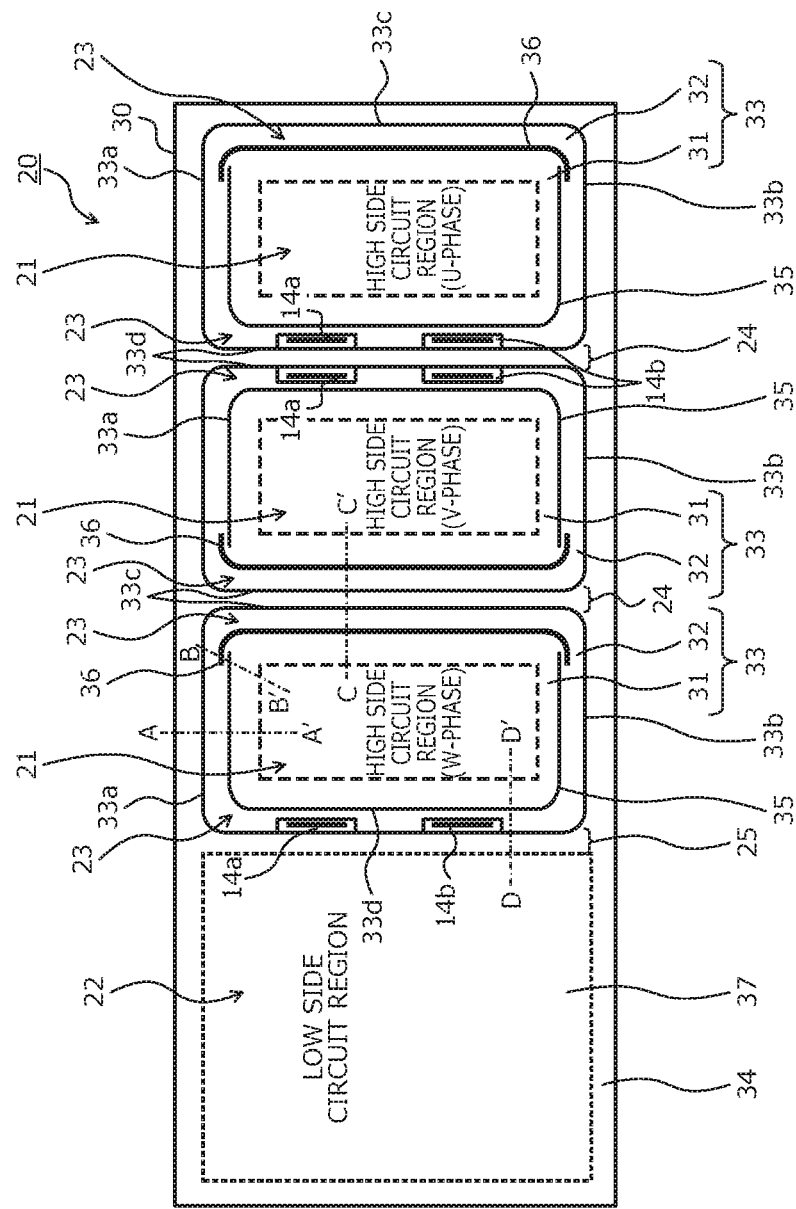
FIG. 12 is a plan diagram of a planar layout of the semiconductor integrated circuit according to a third embodiment.

The structure of a semiconductor integrated circuit according to a third embodiment will be described. FIG. 12 is a plan diagram of a planar layout of the semiconductor integrated circuit according to the third embodiment. The semiconductor integrated circuit according to the third embodiment differs from the semiconductor integrated circuit according to the first embodiment in the planar layout of the HVNMOSs 14a and 14b in the n-type well region 33. For example, the HVNMOSs 14a and 14b are arranged farther outward from the n-type well region 33 than the p-type separation region 35, at positions separated farther from the first VB pick-up region 36 than in the first embodiment.

For example, the HVNMOSs 14a and 14b are arranged along the one side 33d of the n-type well region 33 and along which the first VB pick-up region 36 is not arranged, the one side 33d that is in contact with the interphase region 24 between the n-type well region 33 and the adjacent n-type well region 33 (in this embodiment, between the n-type well regions 33 constituting the U-phase and the V-phase). The HVNMOSs 14a and 14b are arranged along the one side 33d of the n-type well region 33, the one side 33d that is in contact with the interphase region 25 between the n-type well region 33 (in this embodiment, the n-type well region 33 constituting the W-phase) and the adjacent n-type diffusion region 37.

As described above, according to the third embodiment, when the level shifting circuit is arranged along the side of the n-type well region 33 along which the first VB pick-up region is not arranged, effects as those in the first embodiment may be achieved.

The structure of a semiconductor integrated circuit according to a fourth embodiment will be described. FIGS. 13, 14, 15, 16, and 17 are plan diagrams of the planar layout of the semiconductor integrated circuit according to the fourth embodiment. The semiconductor integrated circuit according to the fourth embodiment differs from the first embodiment in the arrangement of the high side circuit region 21 (that is, the arrangement of the n-type well region 33) or the arrangement of the high side circuit region 21 and the low side circuit region 22.

Figure 13:
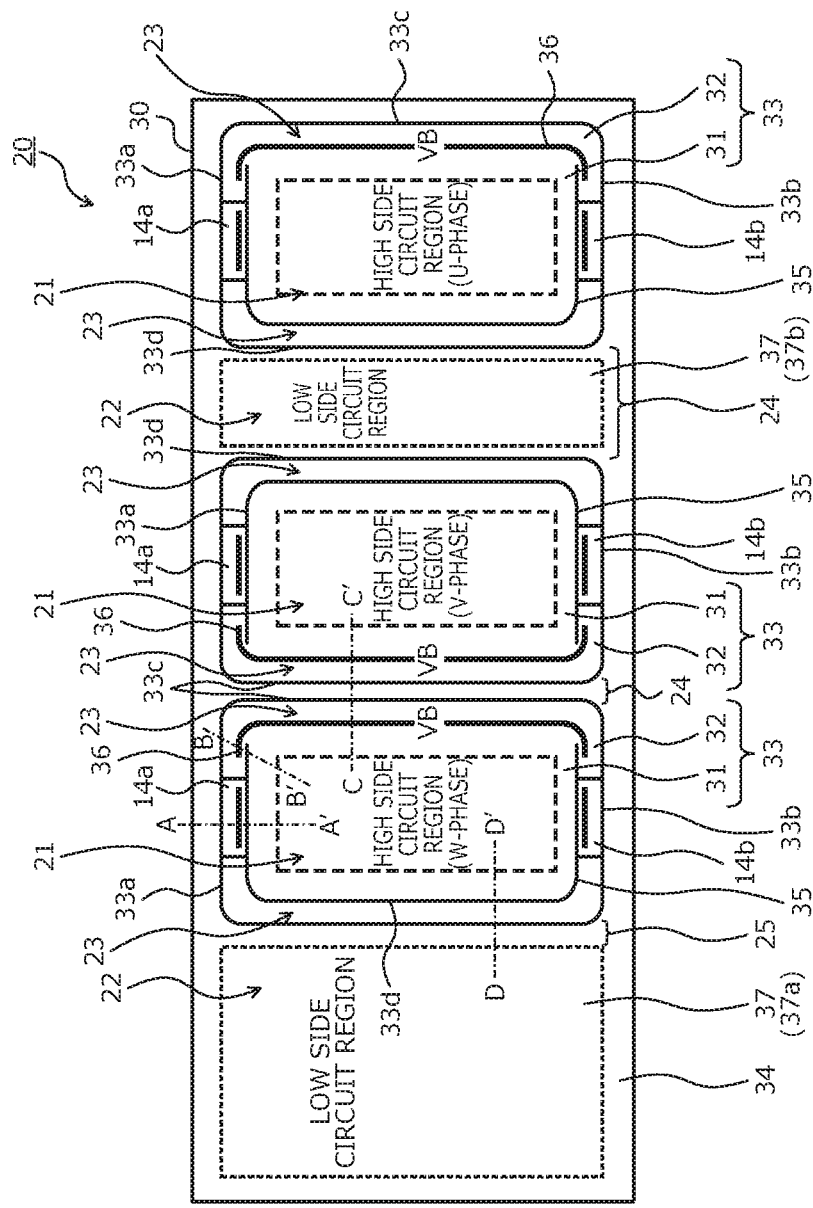
FIGS. 13, 14, 15, 16, and 17 are plan diagrams of the planar layout of the semiconductor integrated circuit according to a fourth embodiment.

The HVIC 20 depicted in FIG. 13 includes more low side circuit regions 22 than the HVIC 20 of the first embodiment (see FIG. 3) and includes the high side circuit regions 21 for the three phases and two low side circuit regions 22 on the semiconductor substrate 30. The three n-type well regions 33 and two n-type diffusion regions 37 are each selectively provided on the semiconductor substrate 30. The three n-type well regions 33 and the two n-type diffusion regions 37 are arranged in parallel to each other in one straight line. The configuration and the arrangement of the regions inside each of the three n-type well regions 33 are same as those in the HVIC 20 of the first embodiment.

The one n-type diffusion region 37a of the two n-type diffusion regions 37 is arranged, for example, to face the one side 33d (along which the first VB pick-up region 36 is not arranged) of the n-type well region 33 that constitutes the W-phase, similarly to that of the HVIC 20 of the first embodiment. The other n-type diffusion region 37b is arranged in the interphase region 24 between the n-type well regions 33 constituting the V-phase and the U-phase. The circuit units of the input signal processing circuit 11a of the HVIC 20 (see FIG. 2) are arranged in any of the two n-type diffusion regions 37.

The input signal processing circuit 11a of the HVIC 20 may be arranged in the interphase region 24 because the interphase region 24 between the n-type well regions 33 constituting the V-phase and the U-phase is separated from all of the first VB pick-up regions 36. The circuit units of the input signal processing circuit 11a of the HVIC 20 are arranged in any one of the n-type diffusion regions 37a and 37b that facilitates this arrangement. For example, the circuit units other than a PG (described later) of the input signal processing circuit 11a and a PG circuit of the W-phase (see FIG. 18) are arranged in the n-type diffusion region 37a adjacent to the n-type well region 33 that constitutes the W-phase. The PG circuits of the V-phase and the U-phase of the input signal processing circuit 11a of the HVIC 20 are arranged in the n-type diffusion region 37b that is arranged in the interphase region 24 between the n-type well regions 33 constituting the V-phase and the U-phase.

The distance is thereby reduced on the front surface of the semiconductor substrate 30 between the PG circuit and the HVNMOSs 14a and 14b. Gate wires of the HVNMOSs 14a and 14b, and the like, therefore, do not need to be run on the semiconductor substrate 30 from the n-type well region 33 in which the HVNMOSs 14a and 14b are arranged to a point separated therefrom, and the variation of the gate driving performance of each of the phases may be reduced. Occurrences of malfunctions such as self-turning on caused by fluctuation of the gate voltage (a phenomenon that the HVNMOSs 14a and 14b are errantly turned on due to an increase of the gate voltages) may be suppressed. The arrangement and the circuit configuration of the input signal processing circuit 11a of the HVIC 20 depicted in FIG. 13 will be described in the fifth embodiment described later.

Figure 14:
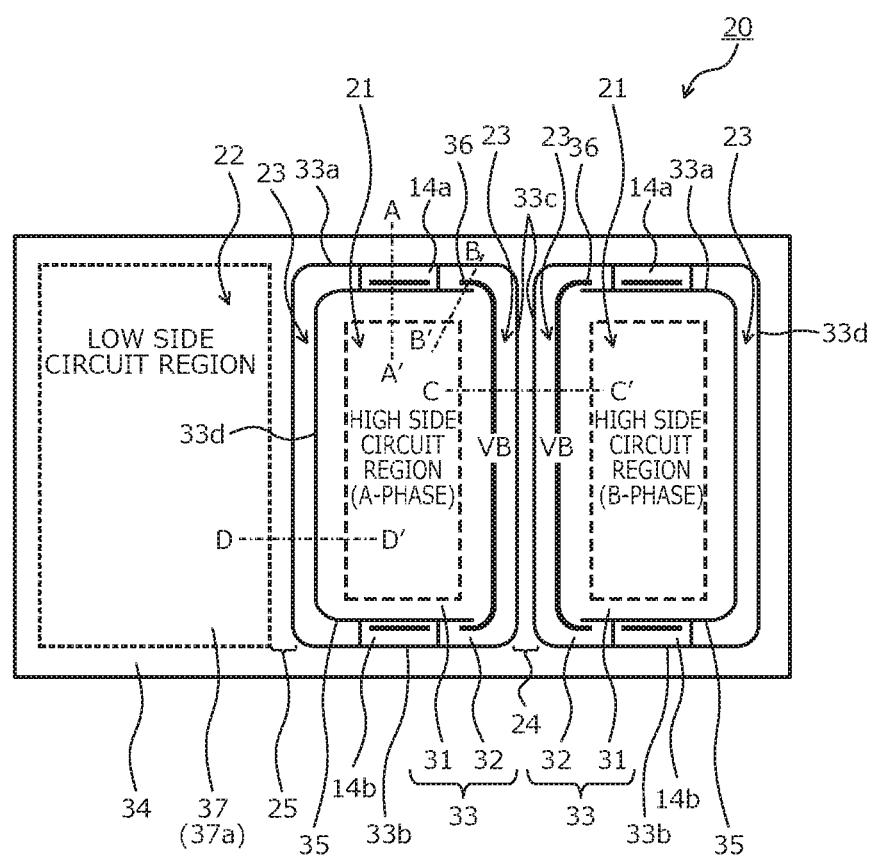

The HVIC 20 depicted in FIG. 14 includes fewer high side circuit regions 21 than the HVIC 20 of the first embodiment (see FIG. 3), and includes the high side circuit regions 21 for two phases (that is, two in this embodiment, an A-phase and a B-phase). The two n-type well regions 33 and the one n-type diffusion region 37 are each selectively provided on the semiconductor substrate 30. The configuration and the arrangement of the regions inside each of the n-type well regions 33 constituting the A-phase and the B-phase are same as those of the n-type well regions 33 constituting the W-phase and the V-phase of the first embodiment. The PG circuits of the input signal processing circuit 11a of the HVIC 20 are provided for the two phases.

Figure 15:
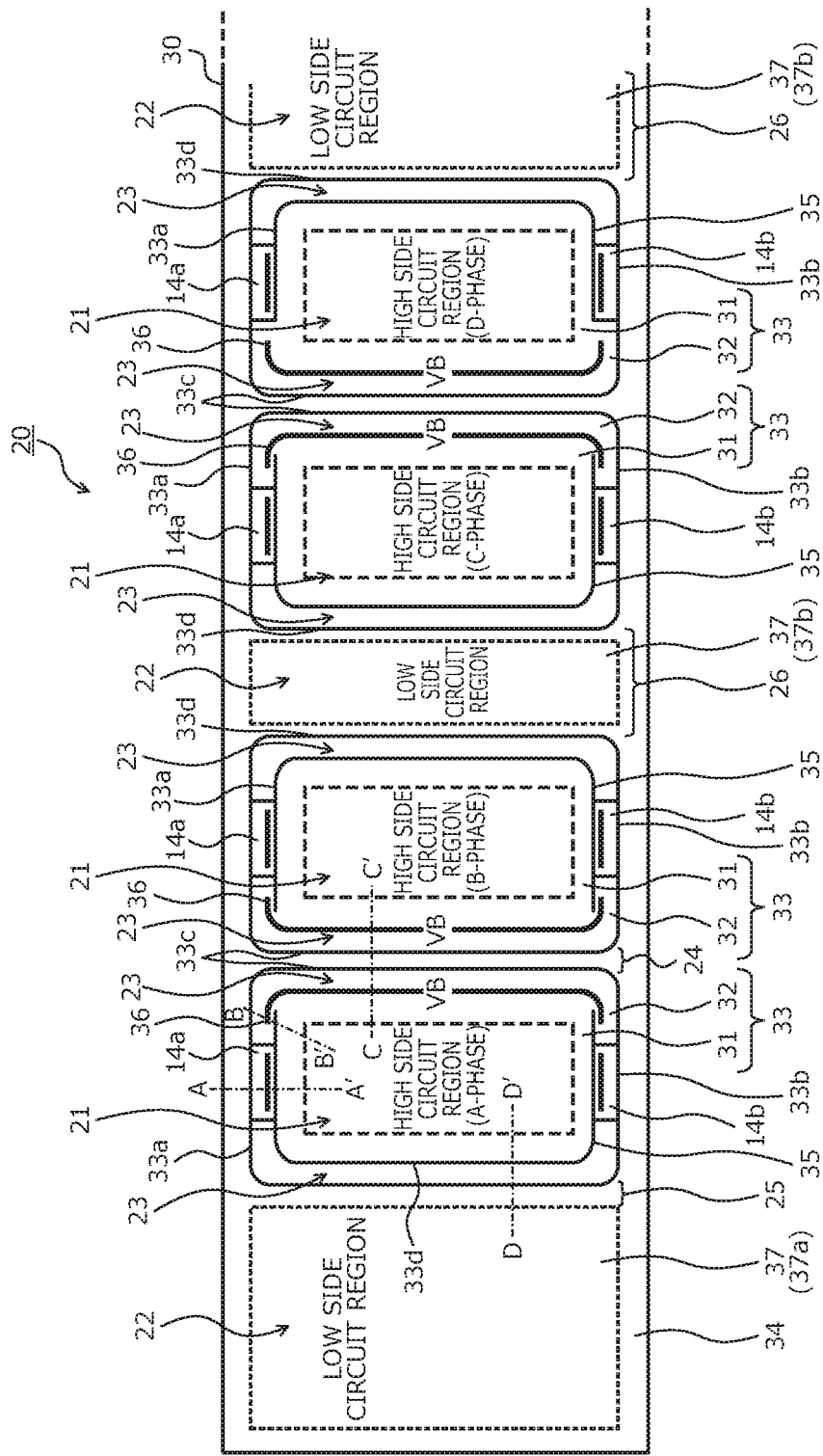

The HVIC 20 depicted in FIG. 15 includes more high side circuit regions 21 than those of the HVIC 20 of the first embodiment (see FIG. 3), and includes the high side circuit regions 21 for four or more phases (that is, four or more in this embodiment, the A-phase, the B-phase, a C-phase, a D-phase, . . . , n-phase. "n" is an arbitrary character and indicates that the phases are different from each other). The four or more n-type well regions 33 are arranged in parallel to each other on the semiconductor substrate 30. The n-type diffusion region 37 is arranged in interphase regions 26 between adjacent n-type well regions 33, at intervals of, for example, two of the n-type well regions 33.

For example, the two n-type well regions 33 and the one n-type diffusion region 37b are arranged in parallel to each other in a single straight line, and one set including the two n-type well regions 33 and the one n-type diffusion region 37b is repeatedly arranged in plural. All the n-type well regions 33 and the n-type diffusion region 37b in the sets are arranged in a same straight line. In FIG. 15, the repeated sets each of the two n-type well regions 33 included in the one set are defined as "A-phase" and "B-phase" for the first set from the left and as "C-phase" and "D-phase" for the second set therefrom. The configuration and the arrangement of the regions inside the two n-type well regions 33 in each of the sets are same as those of the n-type well regions 33 constituting the W-phase and the V-phase of the first embodiment.

The one n-type diffusion region 37a is arranged to, for example, face the one side 33d (along which the first VB pick-up region 36 is not arranged) of the n-type well region 33 constituting the A-phase that is arranged closest to the end. Each one of the other n-type diffusion regions 37b is arranged in the interphase region 24 between adjacent n-type well regions 33, at intervals of two of the n-type well regions 33 that are arranged in parallel to each other. In FIG. 15, the one n-type diffusion region 37b is arranged in an interphase region 26 between the n-type well regions 33 that constitute the B-phase and the C-phase. In addition, FIG. 15 depicts a state where one more of the n-type diffusion regions 37b is further arranged in the interphase region 26 between the n-type well region 33 constituting the D-phase and the n-type well region 33 not depicted that is adjacent to this n-type well region 33 on the right thereof.

In the HVIC 20 depicted in FIG. 15, the circuit units of the input signal processing circuit 11a are arranged in the one n-type diffusion region 37a or the plural n-type diffusion regions 37b that facilitate(s) this arrangement. For example, the circuit units other than the PG circuit of the input signal processing circuit 11a of the HVIC 20 and the PG circuit of the A-phase are arranged in the n-type diffusion region 37a adjacent to the n-type well region 33 that constitutes the A-phase. The PG circuit of each of the phases other than the A-phase of the input signal processing circuit 11a of the HVIC 20 is arranged in the n-type diffusion region 37b arranged in the interphase region 24 between the adjacent n-type well regions 33, at intervals of two of the plural n-type well regions 33 arranged in parallel to each other.

Figure 16:
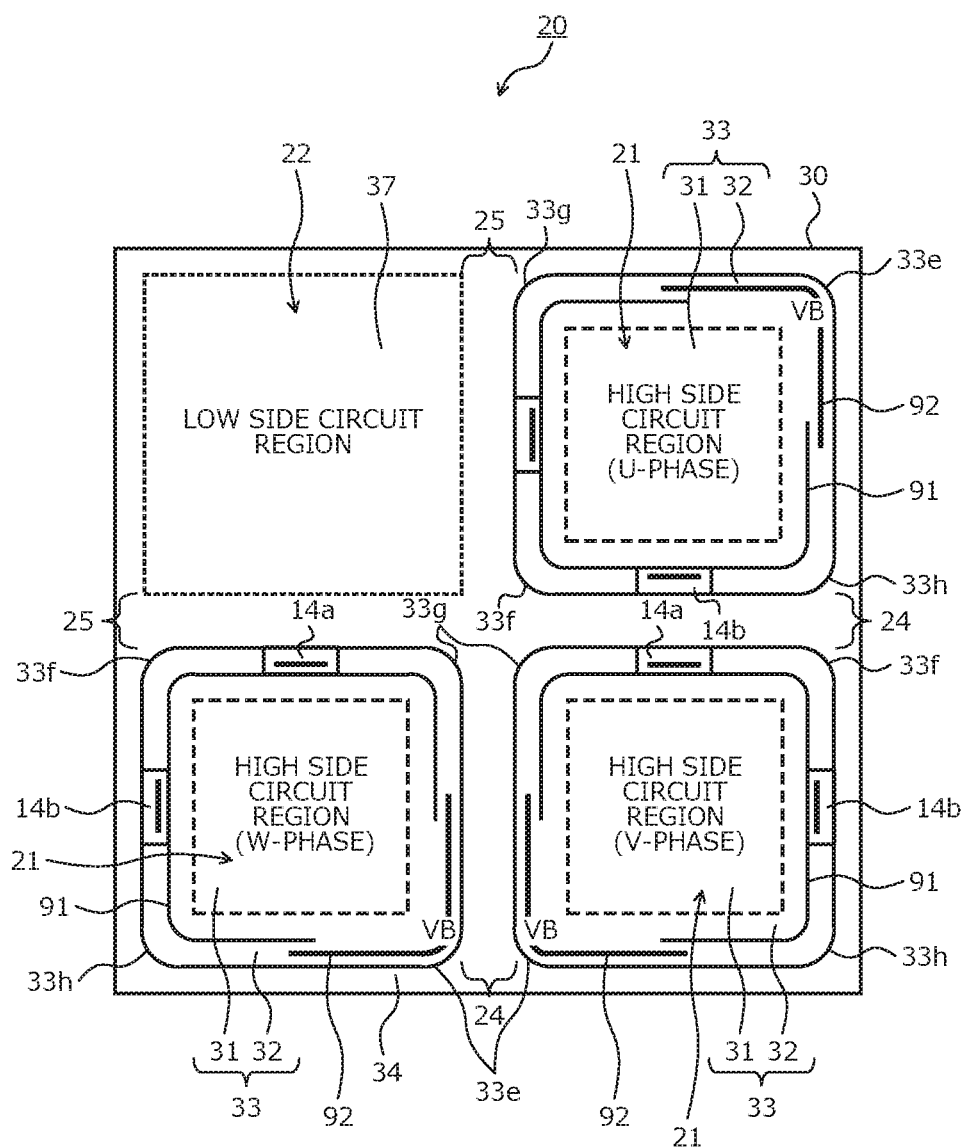

The HVIC 20 depicted in FIG. 16 differs from the HVIC 20 of the first embodiment (see FIG. 3) in that the n-type well regions 33 constituting the high side circuit regions 21 for the three phases and the n-type diffusion region 37 constituting the one low side circuit region 22 are arranged in a matrix-like planar layout. For example, the three n-type well regions 33 and the one n-type diffusion region 37 each have, for example, a substantially square planar shape and are arranged in a planar layout to face the four vertexes of the substantially square-shaped semiconductor substrate 30 on the diagonal lines of the semiconductor substrate 30.

For each of the n-type well regions 33, a p-type separation region 91 is arranged along the outer periphery of the n-type well region 33 in a same manner as in the first embodiment. A first VB pick-up region 92 is arranged along the outer periphery of the n-type well region 33 in a portion where the p-type separation region 91 is not arranged. The HVNMOSs 14a and 14b are individually arranged along different sides along which the first VB pick-up region 92 is not arranged (the sides between vertexes 33f and 33g, and the sides between vertexes 33f and 33h).

For example, the p-type separation region 91 is arranged in a planar layout surrounding the high side circuit region 21 in a rectangular shape that is open at a portion thereof near the one vertex 33e of the n-type well region 33 having a substantially square shape. The p-type separation region 91 extends along the outer periphery of the n-type well region 33 from the vertex 33f facing the one vertex 33e toward the one vertex 33e, faces the remaining three vertexes 33f to 33h other than the one vertex 33e, and is terminated not to reach the one vertex 33e.

The first VB pick-up region 92 is arranged in a substantially L-shape planar layout to face the one vertex 33e of the n-type well region 33 not faced by the p-type separation region 91, the first VB pick-up region 92 being arranged to be along the two sides that commonly have the one vertex 33e. The first VB pick-up region 92 is terminated not to reach the vertexes 33g and 33h that commonly have one side with the vertex 33e, from the one vertex 33e. The end portion of the first VB pick-up region 92 may face the end portion of the p-type separation region 91 on the outer side of the end portion of the p-type separation region 91, in the n-type well region 33.

The sides (along which the first VB pick-up region 92 is arranged) of the n-type well region 33 (the sides between the vertexes 33e and 33g, or the sides between the vertexes 33e and 33h) or the opposing sides thereof (the sides between the vertexes 33f and 33g, or the sides between the vertexes 33f and 33h) face each other sandwiching the interphase region 24 located between the adjacent n-type well regions 33 in the same manner as in the first embodiment. The first VB pick-up region 92 is arranged along the sides of the n-type well region 33 other than the side thereof that faces the n-type diffusion region 37 sandwiching therebetween the interphase region 25 located between the n-type well region 33 and the n-type diffusion region 37.

In FIG. 16, the n-type well regions 33 constituting the U-phase and the W-phase face each other on the one diagonal line of the two diagonal lines of the semiconductor substrate 30, sandwiching the center of the semiconductor substrate 30 therebetween. In addition, FIG. 16 depicts a case where, on the other diagonal line, the n-type well region 33 constituting the V-phase and the n-type diffusion region 37 face each other sandwiching the center of the semiconductor substrate 30. The configuration other than the arrangement of the n-type well regions 33, the n-type diffusion region 37, the p-type separation region 91, and the first VB pick-up region 92 of the HVIC 20 depicted in FIG. 16 is a same as that of the HVIC 20 in the first embodiment (see FIG. 3).

Figure 17:
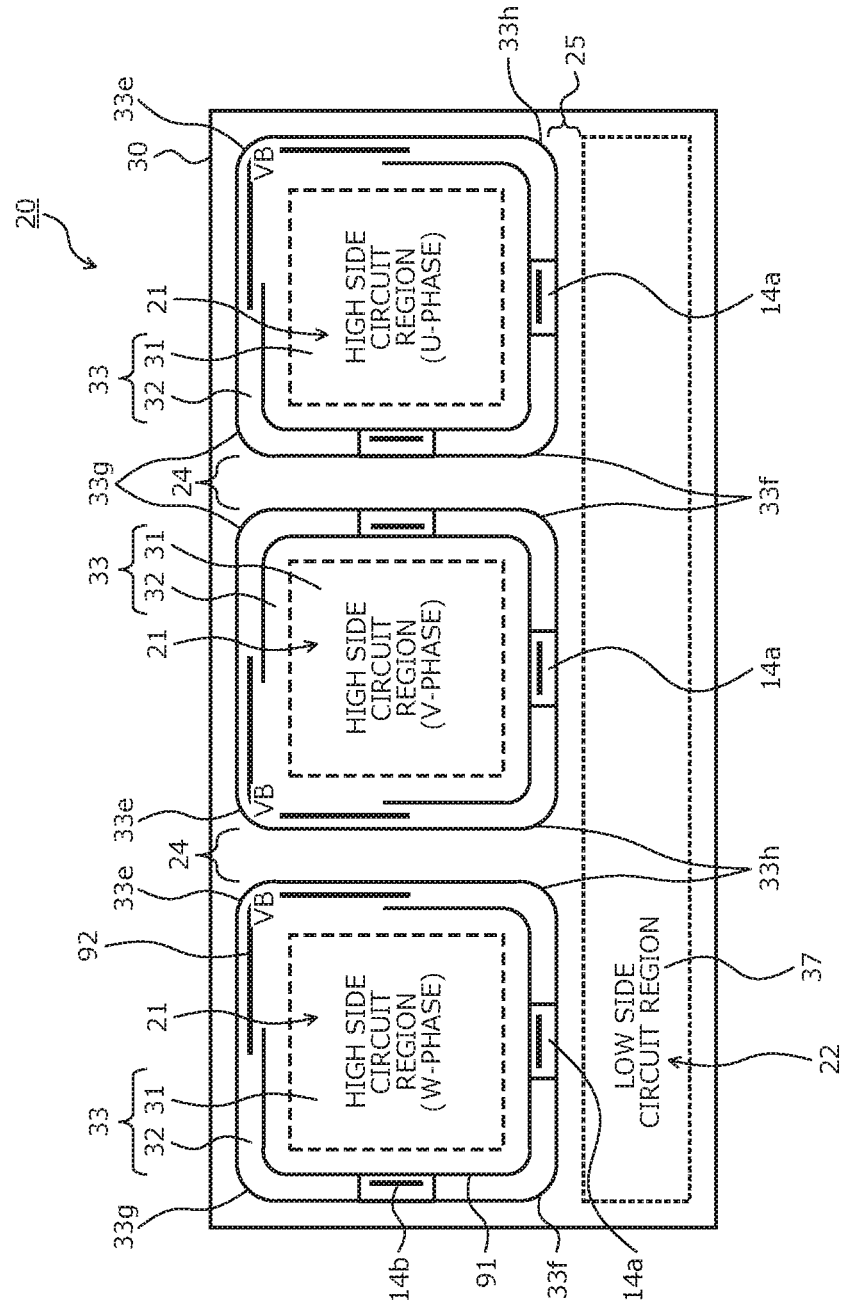

The HVIC 20 depicted in FIG. 17 differs from the HVIC 20 depicted in FIG. 16 in that the n-type diffusion region 37 is arranged to face all the n-type well regions 33. The three n-type well regions 33 are arranged in parallel to each other in a single straight line. The configuration other than the arrangement of the three n-type well regions 33 is, for example, a same as that of the HVIC 20 depicted in FIG. 16. The n-type diffusion region 37 has a substantially rectangular planar shape that faces all the n-type well regions 33, and faces the sides of the n-type well regions 33 along which the first VB pick-up region 92 is not arranged (for example, the sides between the vertexes 33f and 33h).

As described above, according to the fourth embodiment, effects similar to those of the first embodiment may be achieved even when the n-type well regions for two phases, or four or more phases are arranged.

Figure 18:
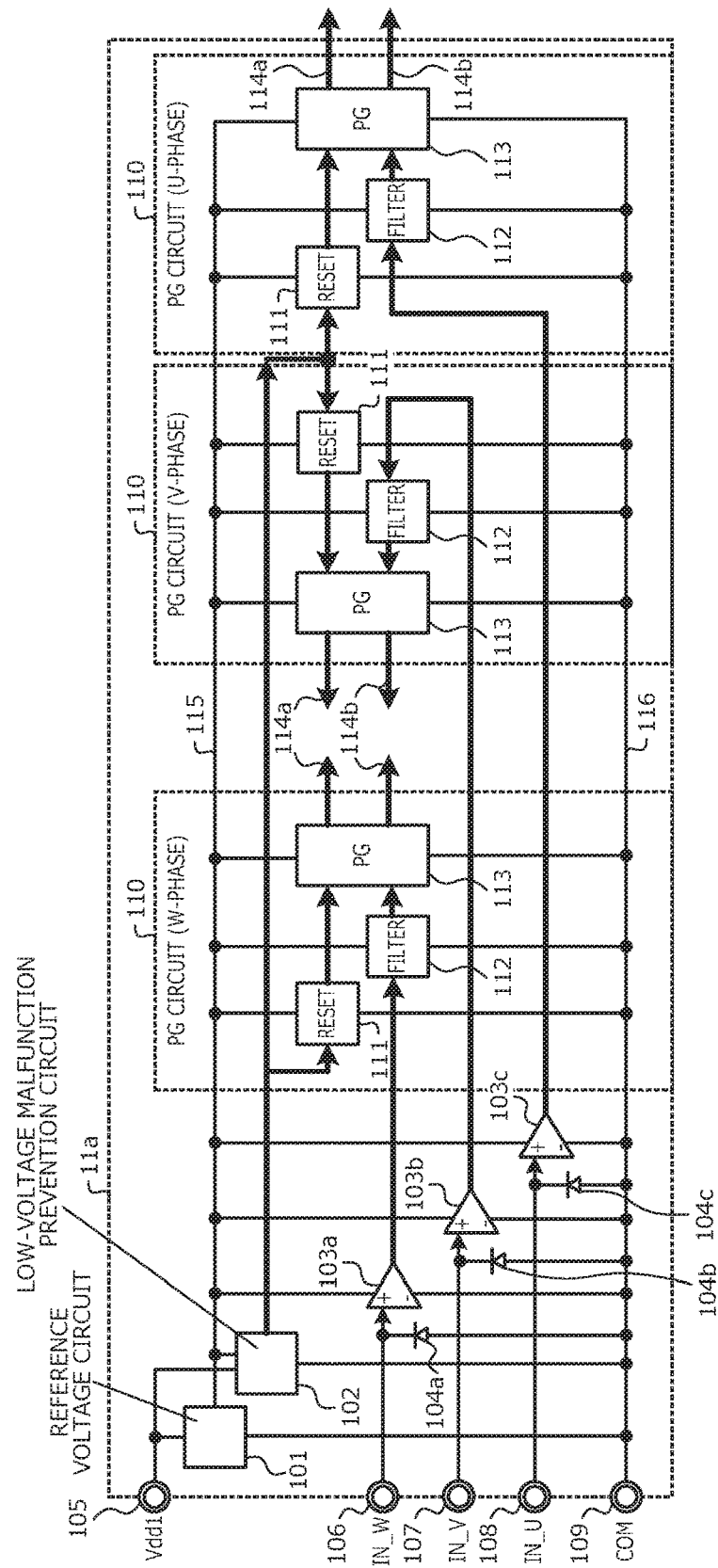
FIG. 18 is a circuit diagram of a circuit configuration of an input signal processing circuit of a HVIC.

In a fifth embodiment, the circuit configuration of the input signal processing circuit 11a of the HVIC 20 arranged in the low side circuit region 22 will be described. FIG. 18 is a circuit diagram of the circuit configuration of the input signal processing circuit of the HVIC. The circuit configuration of the input signal processing circuit 11a of the HVIC 20 depicted in FIG. 18 is applied to the HVICs 20 of the first to the fourth embodiments (FIGS. 3 and 12 to 17). The input signal processing circuit 11a of the HVIC 20 includes a reference voltage circuit 101, a low-voltage malfunction prevention circuit 102, comparators (comparing devices) 103a to 103c for the three phases, first to fifth terminals 105 to 109, and a PG circuit 110. The PG circuit 110 includes a resetting (RESET) circuit 111, a low-pass filter 112, and a pulse generating circuit 113.

The reference voltage circuit 101 is, for example, a regulator that converts the power source potential Vdd1 (for example, 15 V) into an internal power source potential (for example, 5 V) using the common potential COM (the potential of a low potential side line 116) as the reference. The power source potential Vdd1 is input to the first terminal 105. A high potential side line 115 is connected to the internal power source potential to be an output of the reference voltage circuit 101. A low potential side line 116 is connected to the fifth terminal 109 at the common potential COM, and the potential thereof is fixed at the common potential COM.

The low-voltage malfunction prevention circuit 102 has an under-voltage lock out (UVLO) function of preventing malfunction of the PG circuit by discontinuing the output to the resetting circuit 111 when the power source potential Vdd1 of the PG circuit 110 becomes a predetermined voltage or lower. The comparators 103a to 103c are connected in parallel between the high potential side line 115 and the low potential side line 116.

One input (+) terminal of each of the comparators 103a to 103c are connected respectively to the second to the fourth terminals 106 to 108, and a reference potential (not depicted) for the comparators 103a to 103c is applied to the other input (−) terminal thereof. The comparators 103a to 103c respectively receive input signals from the second to the fourth terminals 106 to 108 and each compares the potential of the input signal with a predetermined reference voltage to output a low level signal. The outputs of the comparators 103a to 103c (the comparison results) are respectively input to the low-pass filters 112 of the PG circuits 110 of the phases (the W-phase, the V-phase, and the U-phase) to each be output to the pulse generating circuit 113 through the low-pass filter 112.

The second to the fourth terminals 106 to 108 are input terminals into which input signals IN_W, IN_V, and IN_U for the PG circuits 110 of those phases are respectively input, and each corresponds to an input terminal IN1 in FIG. 2. Cathode terminals of Zener diodes 104a to 104c are respectively connected between the input (+) terminals of the comparators 103a to 103c and the second to the fourth terminals 106 to 108. Anode terminals of the Zener diodes 104a to 104c are connected to the low potential side line 116. The Zener diodes 104a to 104c have functions of maintaining the voltages respectively applied to the input (+) terminals of the comparators 103a to 103c.

The resetting circuit 111 has a function of controlling the outputs from the pulse generating circuit 113 to the HVN-MOSs 14a and 14b. The pulse generating circuit 113 is, for example, a pulse generator (PG) that receives an input signal from the low-pass filter 112 and that outputs a setting (Set) signal 114a and a resetting (Reset) signal 114b. The setting signal 114a and the resetting signal 114b are gate signals to respectively drive the gates of the HVNMOSs 14a and 14b, and are respectively input to the HVNMOSs 14a and 14b of the corresponding phase from the pulse generating circuit 113 of the PG circuit of the phase.

The circuit units of the input signal processing circuit 11a depicted in FIG. 18 (the reference voltage circuit 101, the low-voltage malfunction prevention circuit 102, the comparators 103a to 103c for the three phases, and the circuit units of the PG circuits 110 for the three phases (the resetting circuits 111, the low-pass filters 112, and the pulse generating circuits 113)) are all arranged in the one low side circuit region 22 in the HVIC 20 depicted in FIGS. 3, 12, and 14. In the HVIC 20 depicted in FIG. 13, the circuit units of the input signal processing circuit 11a depicted in FIG. 18 are arranged being divided and arranged, for example, in the two low side circuit regions 22 as depicted in FIG. 19.

Figure 19:
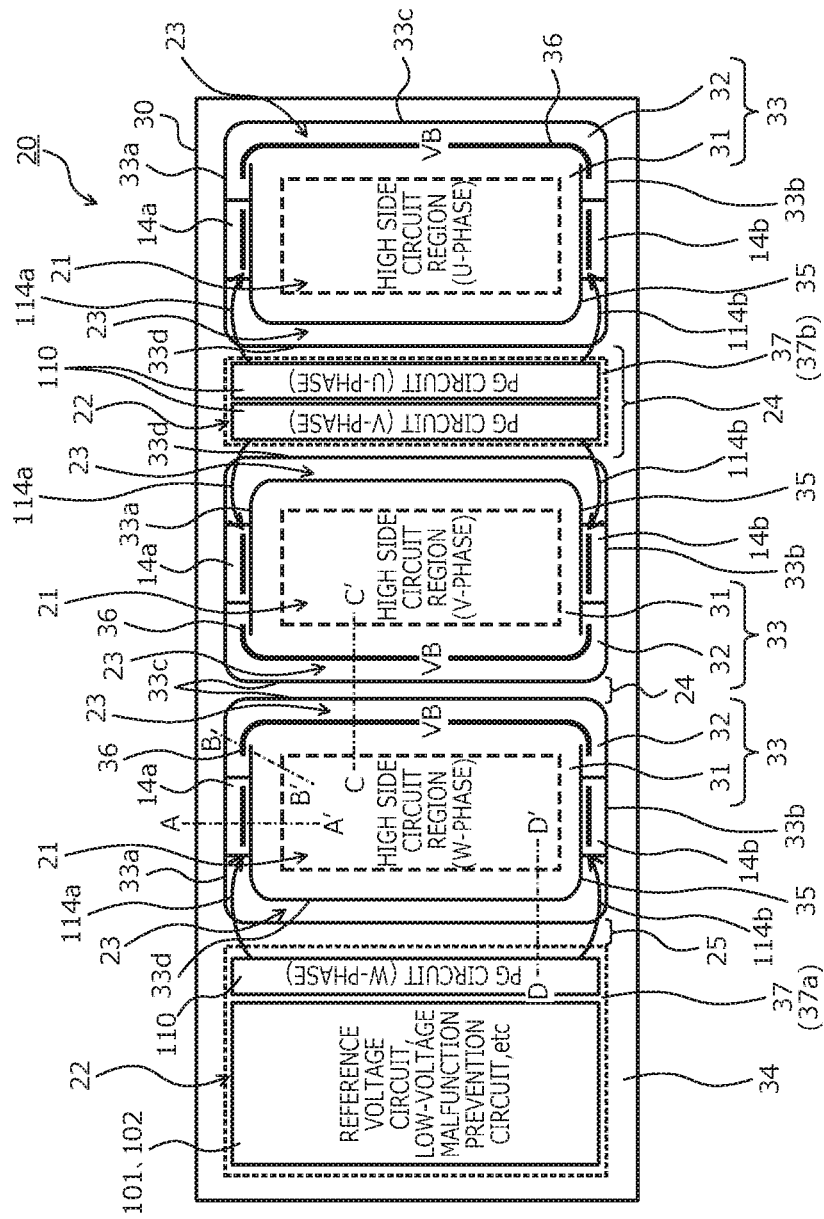
FIG. 19 is a plan diagram of an example of a planar layout of the input signal processing circuit of the HVIC of FIG. 13.

FIG. 19 is a plan diagram of an example of the planar layout of the input signal processing circuit of the HVIC of FIG. 13. As depicted in FIG. 19, the circuit units other than the PG circuit 110 of the input signal processing circuit 11a of the HVIC 20 (the reference voltage circuit 101, the low-voltage malfunction prevention circuit 102, the comparators 103a to 103c, and the Zener diodes 104a to 104c) and the circuit units of the PG circuit 110 of the W-phase are arranged in the n-type diffusion region 37a adjacent to the n-type well region 33 that constitutes the W phase, among the two n-type diffusion regions 37. The circuit units of the PG circuit 110 of the W-phase are arranged on the side of the n-type diffusion region 37a facing the n-type well region 33 constituting the W-phase, and the circuit units output the setting signal 114a and the resetting signal 114b to each of the HVNMOSs 14a and 14b arranged in the n-type well region 33.

The circuit units of the PG circuits 110 of the V-phase and the U-phase of the input signal processing circuit 11a of the HVIC 20 are arranged in the n-type diffusion region 37b that is arranged in the interphase region 24 between the n-type well regions 33 constituting the V-phase and the U-phase, among the two n-type diffusion regions 37. The circuit units of the PG circuit 110 of the V-phase are arranged on the side of the n-type diffusion region 37b facing the n-type well region 33 constituting the V-phase, and the circuit units output the setting signal 114a and the resetting signal 114b to the HVNMOSs 14a and 14b arranged in the n-well region 33. The circuit units of the PG circuit 110 of the U-phase are arranged on the side of the n-type diffusion region 37b facing the n-type well region 33 constituting the U-phase, and the circuit units output the setting signal 114a and the resetting signal 114b to the HVNMOSs 14a and 14b arranged in the n-well region 33.

As described above, the fifth embodiment is applicable to the first to the fourth embodiments.

The current amount injected into the HVNMOSs 14a and 14b of the high side circuit region 21 when noise was applied was verified by simulation. FIGS. 20A1 and 20A2 are perspective diagrams of the configurations used in the simulations for Example and Comparative Example. FIGS. 20B1 and 20B2 are waveform diagrams of the waveforms of the noise applied to the first VB pick-up region of each of Example and Comparative Example of FIGS. 20A1 and 20A2. FIGS. 20C1 and 20C2 are charts of injected current ratios of Example and Comparative Example of FIGS. 20A1 and 20A2.

FIG. 20A2 depicts the high side circuit regions 21 (the n-type well regions 33) of the V-phase and the W-phase of the semiconductor integrated circuit according to the first embodiment (FIG. 3) (hereinafter, referred to as "Example 131"). In Example 131, the n-type well regions 33 are arranged such that the sides 33c of the n-type well regions 33 constituting the W-phase and the V-phase (the sides 33c along which the first VB pick-up region 36 is arranged) face each other sandwiching the interphase region 24 therebetween.

FIG. 20A1 depicts the high side circuit regions 21 (the n-type well regions 33) of the W-phase and the V-phase of Comparative Example 132. Comparative Example 132 differs from Example 131 in that the side 33c (along which the first VB pick-up region 36 is arranged) of the n-type well region 33 constituting the V-phase and the side 33d (the side opposite of the side 33c) along which the first VB pick-up region 36 is not arranged of the n-type well region 33 constituting the W-phase faced each other sandwiching the interphase region 24 therebetween.

For Example 131 and Comparative Example 132, FIGS. 20C1 and 20C2 depict the result of simulation for the current amount of the interphase noise injected into the n$^+$-type drain region 64 of each of the HVNMOSs 14a and 14b arranged in the n-type well region 33 constituting the W-phase acquired when noise (±dV/dt noise, a negative voltage surge) is applied to the first VB pick-up region 36 arranged in the n-type well region 33 constituting the V-phase. The portion on the right in FIGS. 20C1 and 20C2 depicts the result for Example 131 and the portion on the left therein depicts the result for Comparative Example 132.

The noise applied to the n-type well region 33 constituting the V-phase was a "±dV/dt noise" depicted in FIG. 2061 and was a "negative voltage surge" depicted in FIG. 2062. The "±dV/dt noise" refers to a transitional abnormal voltage fluctuation during a minute time period dt [s: second] of the voltage applied to the n-type diffusion region 31 in which the high side circuit region 21 is arranged (the highest potential VB of the high side driving circuit 12). The "negative voltage surge" refers to the fact that the potential of the n-type diffusion region 31 becomes lower than the common potential COM (in this case, the ground potential GND).

It was confirmed that, as depicted in FIG. 20C1, for Comparative Example 132, when the ±dV/dt noise was applied to the n-type well region 33 constituting the V-phase, the maximal current flowing through the n$^+$-type drain region 64 (in FIGS. 20C1 and 20C2, denoted by "the other phase Dr") of each of the HVNMOSs 14a and 14b of the W-phase was $-9.55 \times 10^{-4}$ A. In addition, the maximal current flowing through the interphase region 24 (in FIGS. 20C1 and 20C2, denoted by "GND") between the n-type well regions 33 constituting the V-phase and the W-phase was $-1.08 \times 10^{-1}$ A. At this time, the ratio of the current injected from the n-type well region 33 constituting the V-phase to that of the n-type well region 33 constituting the W-phase (hereinafter, referred to as "injected current ratio from the V-phase to the W-phase") was $(-9.55 \times 10^{-4}$ A/$-1.08 \times 10^{-1}$ A)$\times 100 \approx 0.8842\%$.

As depicted in FIG. 20C2, for Comparative Example 132, it was confirmed that, when the negative voltage surge was applied to the n-type well region 33 constituting the V-phase, the maximal current flowing through the n$^+$-type drain region 64 of each of the HVNMOSs 14a and 14b of the W-phase was $9.09 \times 10^{-4}$ A. In addition, the maximal current flowing through the interphase region 24 between the n-type well regions 33 constituting the V-phase and the W-phase was $4.25 \times 10^1$ A. At this time, the injected current ratio from the V-phase to the W-phase was $(9.09 \times 10^{-4}$ A/$4.25 \times 10^1$ A)$\times 100 \approx 0.0021\%$.

On the other hand, as depicted in FIG. 20C1, for Example, it was confirmed that, when the ±dV/dt noise was applied to the n-type well region 33 constituting the V-phase, the maximal current flowing through the n$^+$-type drain region 64 of each of the HVNMOSs 14a and 14b of the W-phase was $-5.19 \times 10^{-4}$ A. In addition, the maximal current flowing through the interphase region 24 between the n-type well regions 33 constituting the V-phase and the W-phase was $-1.04 \times 10^{-1}$ A. At this time, the injected current ratio from the V-phase to the W-phase was $(-5.19 \times 10^{-4}$ A/$-1.04 \times 10^{-1}$ A)$\times 100 \approx 0.4990\%$. Therefore, Example was able to reduce the injected current ratio from the V-phase to the W-phase when the ±dV/dt noise was applied, by about 44% ($\approx [1-(0.4990\%/0.8842\%)] \times 100$) compared to that of Comparative Example.

As depicted in FIG. 20C2, for Example, it was confirmed that, when the negative voltage surge was applied to the n-type well region 33 constituting the V-phase, the maximal current flowing through the n$^+$-type drain region 64 of each of the HVNMOSs 14a and 14b of the W-phase was $4.26 \times 10^{-6}$ A. In addition, the maximal current flowing through the interphase region 24 between the n-type well regions 33 constituting the V-phase and the W-phase was $4.24 \times 10^1$ A. At this time, the injected current ratio from the V-phase to the W-phase was $(4.26 \times 10^{-6}$ A/$4.24 \times 10^1$ A)$\times 100 \approx 0.00001\%$. Therefore, Example was able to reduce the injected current ratio from the V-phase to the W-phase when the negative voltage surge was applied, by about 99.5% ($\approx [1-(0.00001\%/0.0021\%)] \times 100$) compared to that of Comparative Example.

The present invention is not limited to the embodiments and may be modified variously within a scope not departing from the spirit of the present invention. For example, although description has been made in the embodiments taking an example of a case where the planar shape of each of the n-type well region constituting the high side circuit region and the n-type diffusion region constituting the low side circuit region is a rectangular shape, the planar shape of each of the n-type well region and the n-type diffusion region is not limited hereto and may be modified variously. The outer periphery portions of the n-type well regions along which the first VB pick-up region is arranged, may face each other or the outer periphery portions of the n-type well regions (or the n-type well region and the n-type diffusion region) along which the first VB pick-up region is not arranged, may face each other, sandwiching therebetween the interphase region located between the adjacent n-type well regions (or between the n-type well region and the n-type diffusion region adjacent to each other), and the planar shape of each of the n-type well region and the n-type diffusion region may be, for example, a circular shape or a polygonal shape other than the rectangular shape. The present invention is further implemented when the conductivity types (the n type and the p type) are inverted to each other.

According to the present invention, the third semiconductor region in one phase (the first semiconductor region) acts as a potential barrier and the injection of holes into the one phase is suppressed. According to the present invention, noise unable to fully be absorbed by the third semiconductor region and flowing into another phase (another first semiconductor region) (interphase noise) may be mainly absorbed by the fourth semiconductor region in the other phase. Therefore, malfunction caused by the interphase noise may be suppressed.

According to the semiconductor integrated circuit of the present invention, the semiconductor integrated circuit is a semiconductor integrated circuit that includes the plural semiconductor regions (plural phases) electrically separated from each other in accordance with the separation method based on the pn-junction on a single semiconductor substrate and an effect is achieved in that malfunction in one phase caused by a noise generated in the one phase and that caused by a noise generated in another phase (interphase noise) may be suppressed.

As described above, the semiconductor integrated circuit according to the present invention is useful for semiconductor integrated circuits used in power converting equipment such as inverters and in power source devices in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:
a semiconductor substrate having a plurality of first potential side areas, the plurality of first potential side area including a first two adjacent first potential side areas, each first potential side area including:
a high potential side circuit;
a first semiconductor region of a first conductivity type selectively provided in a surface layer on a front surface of a semiconductor substrate;
a second semiconductor region of a second conductivity type selectively provided in the first semiconductor region, the second semiconductor region penetrating the first semiconductor region in a depth direction from the front surface of the semiconductor substrate; and
a third semiconductor region of the first conductivity type selectively provided in the first semiconductor region so as to be separated from the second semiconductor region, a potential of the third semiconductor region being fixed at a potential higher than a potential of the second semiconductor region, the high potential side circuit being arranged to be closer to a center of the first semiconductor region than the third semiconductor region, wherein
the first two adjacent first potential side areas includes respective first side areas that face each other, that each include the third semiconductor region thereof, and that each are free of the second semiconductor region thereof.

2. The semiconductor integrated circuit according to claim 1, wherein
the plurality of first potential side areas includes a second two adjacent first potential side areas, and
the second two adjacent first potential side areas include respective second side areas that face each other, that each include the second semiconductor region thereof, and that each are free of the third semiconductor region thereof.

3. The semiconductor integrated circuit according to claim 1, wherein
the first semiconductor region has a substantially rectangular planar shape with four sides in a plan view, and
the first side area includes an entire first side of the four sides of the first semiconductor region, and is free of the second semiconductor region.

4. The semiconductor integrated circuit according to claim 3, wherein
the plurality of first potential side areas includes a second two adjacent first potential side areas, one of the second two adjacent first potential side areas including one of the first two adjacent first potential side areas,
the second two adjacent first potential side areas include respective second side areas that face each other, that each include the second semiconductor region thereof, and that each are free of the third semiconductor region thereof, and
the first side area in the one of the second two adjacent first potential side areas is a side area opposite to the second side area.

5. The semiconductor integrated circuit according to claim 1, wherein the semiconductor substrate further comprises a second potential side area, the second potential side area including:
a low potential side circuit operating at a reference voltage lower than that of the high potential side circuit; and
a fourth semiconductor region of the first conductivity type selectively provided in the surface layer on the front surface of the semiconductor substrate, the fourth semiconductor region being arranged at an area of the surface layer adjacent to one of the first potential side areas, wherein
the second potential side area faces one of the first potential side areas, and the one of the first potential side areas includes a third side area facing the second potential side area, including the second semiconductor region thereof, and being free of the third semiconductor region thereof.

6. The semiconductor integrated circuit according to claim 2, wherein the semiconductor substrate further comprises a second potential side area, the second potential side area including:
a low potential side circuit operating at a reference voltage lower than that of the high potential side circuit; and
a fourth semiconductor region of the first conductivity type selectively provided in the surface layer on the front surface of the semiconductor substrate, wherein
the second potential side area is disposed between two adjacent ones of the first potential side areas, each of the two adjacent ones of the first potential side areas including a side area facing the second potential side area and being free of the third semiconductor region.

7. The semiconductor integrated circuit according to claim 1, wherein the first semiconductor region includes two first semiconductor regions, one of the two first semiconductor regions facing the high potential side circuit, the other of the two first semiconductor regions being in contact with the one first semiconductor region, the other first semiconductor region surrounding the one first semiconductor region, the other first semiconductor region having an impurity concentration lower than an impurity concentration of the one first semiconductor region.

* * * * *